United States Patent
Lopez et al.

(10) Patent No.: US 12,284,846 B2
(45) Date of Patent: Apr. 22, 2025

(54) LIGHT-EMITTING DEVICE WITH INTERNAL NON-SPECULAR LIGHT REDIRECTION AND POSITION-DEPENDENT REFLECTION, TRANSMISSION, OR REDIRECTION

(71) Applicant: Lumileds LLC, San Jose, CA (US)

(72) Inventors: Toni Lopez, Vaals (NL); Venkata Ananth Tamma, San Jose, CA (US); Aimi Abass, Aachen (DE)

(73) Assignee: Lumileds LLC, San Jose, CA (US)

( * ) Notice: Subject to any disclaimer, the term of this patent is extended or adjusted under 35 U.S.C. 154(b) by 472 days.

(21) Appl. No.: 17/825,143

(22) Filed: May 26, 2022

(65) Prior Publication Data

US 2022/0393076 A1    Dec. 8, 2022

Related U.S. Application Data

(60) Provisional application No. 63/197,648, filed on Jun. 7, 2021.

(51) Int. Cl.
*H10H 20/855*    (2025.01)
*H10H 20/841*    (2025.01)
(Continued)

(52) U.S. Cl.
CPC ........ *H10H 20/841* (2025.01); *H10H 20/855* (2025.01); *H01L 25/167* (2013.01); *H10H 20/872* (2025.01)

(58) Field of Classification Search
None
See application file for complete search history.

(56) References Cited

U.S. PATENT DOCUMENTS

| 11,641,007 B2 * | 5/2023 | Lopez-Julia | H01L 33/005 |
| | | | 257/79 |
| 2008/0303047 A1 | 12/2008 | Shen et al. | |

(Continued)

FOREIGN PATENT DOCUMENTS

| JP | 2001308457 A | 11/2001 |
| JP | 4928651 B2 | 5/2012 |

OTHER PUBLICATIONS

From the Korean Intellectual Property Office as the ISA, "Notification of Transmittal of the International Search Report and the Written Opinion, of the International Searching Authority, or the Declaration", PCT/US2022/032070, Oct. 11, 2022, 11 pages.

*Primary Examiner* — Nicholas J Tobergte

(57) ABSTRACT

A semiconductor diode structure has one or more light-emitting active layers and a redirection layer on the back surface that includes one or more of an array of nano-antennae, a partial photonic bandgap structure, a photonic crystal, or an array of meta-atoms or meta-molecules, and exhibits non-specular internal reflective redirection of output light incident thereon within the diode structure. One or both of the front or back surfaces exhibit position-dependent redirection, reflection, or transmission of the output light, including one or both of (i) position-dependent internal reflective redirection of output light incident on the back-surface or (ii) position-dependent internal reflective redirection, or position-dependent transmissive redirection, of output light incident on a front-surface layer or coating. Position dependence of luminance of output light exiting the diode structure can differ from position dependence of emission from the active layer. With uniform emission across the active layer, output light can exhibit position-dependent luminance.

18 Claims, 16 Drawing Sheets

(51) Int. Cl.
*H01L 25/16* (2023.01)
*H10H 20/80* (2025.01)

(56) References Cited

U.S. PATENT DOCUMENTS

| | | | |
|---|---|---|---|
| 2013/0126901 A1 | 5/2013 | Isoazaki et al. | |
| 2019/0115492 A1 | 4/2019 | Tamma et al. | |
| 2020/0124834 A1* | 4/2020 | Woodgate | G02F 1/133603 |
| 2020/0335661 A1* | 10/2020 | Tamma | H01L 33/10 |
| 2021/0184081 A1 | 6/2021 | Lopez-Julia et al. | |

* cited by examiner

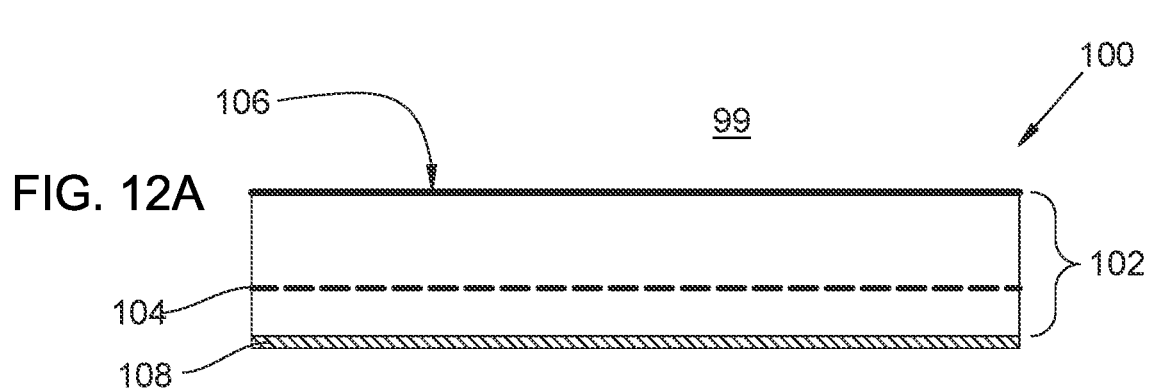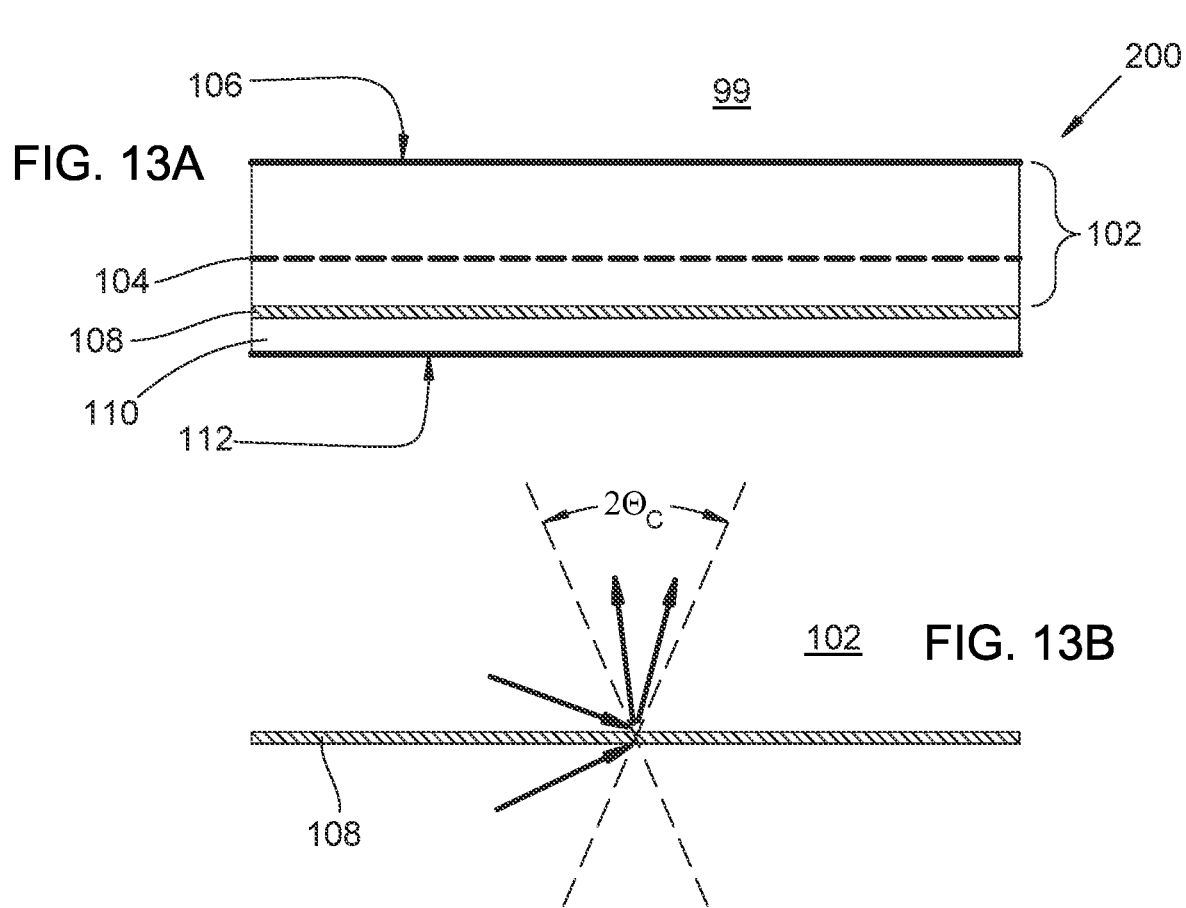

FIG. 20A
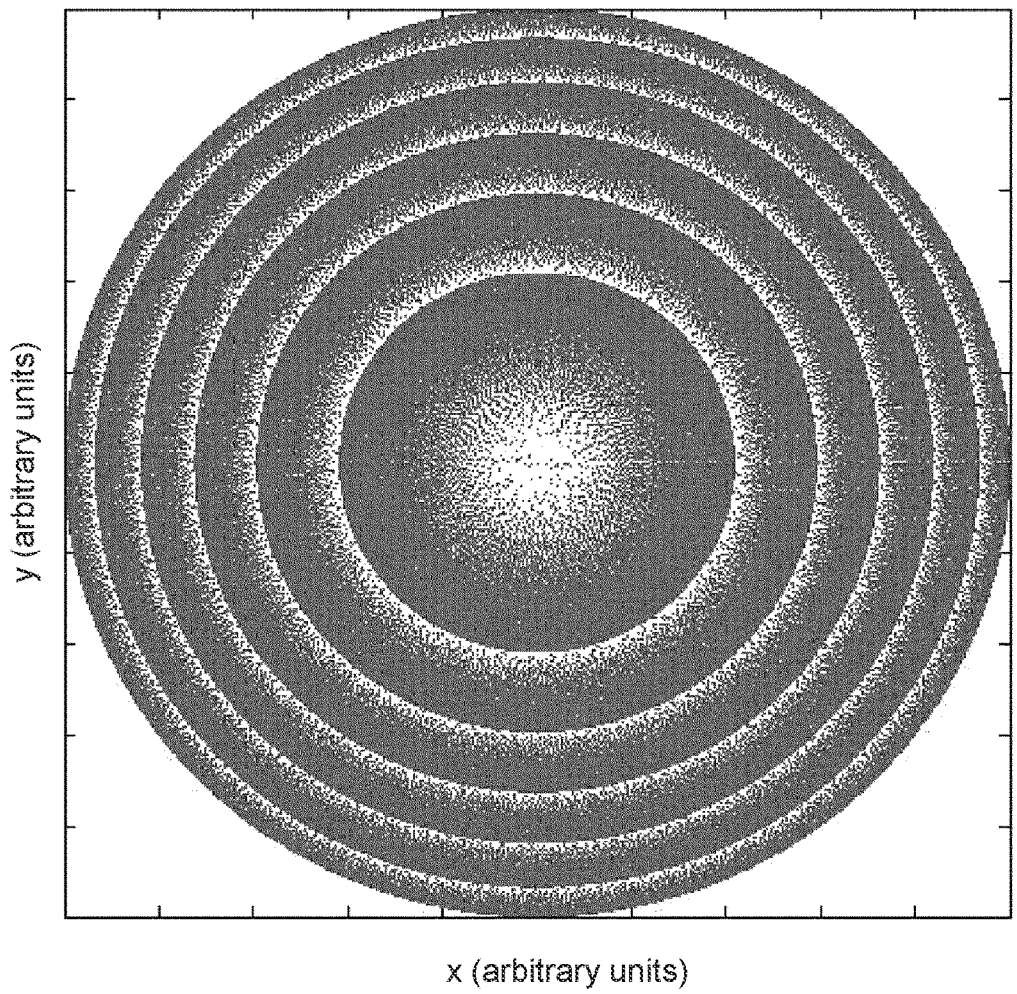
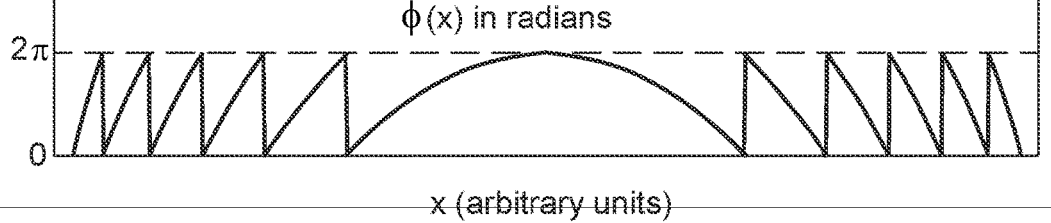
FIG. 20B

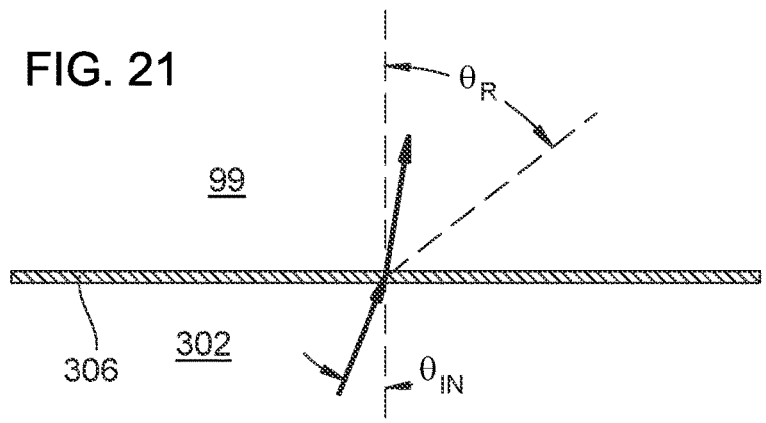
FIG. 21
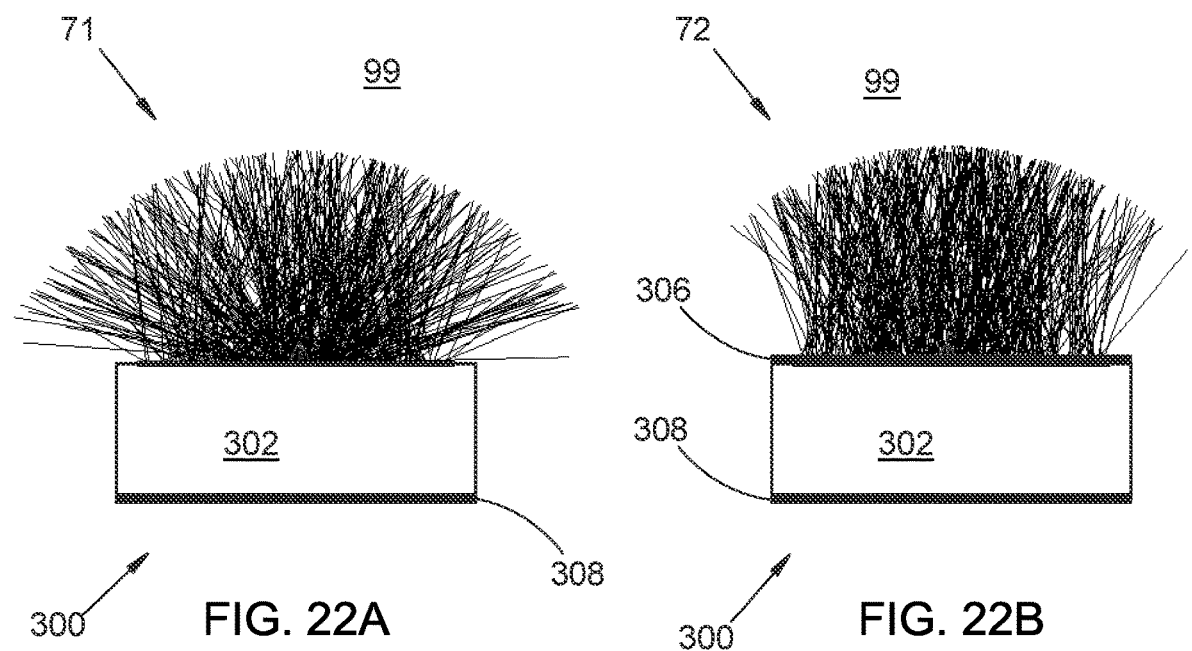
FIG. 22A
FIG. 22B

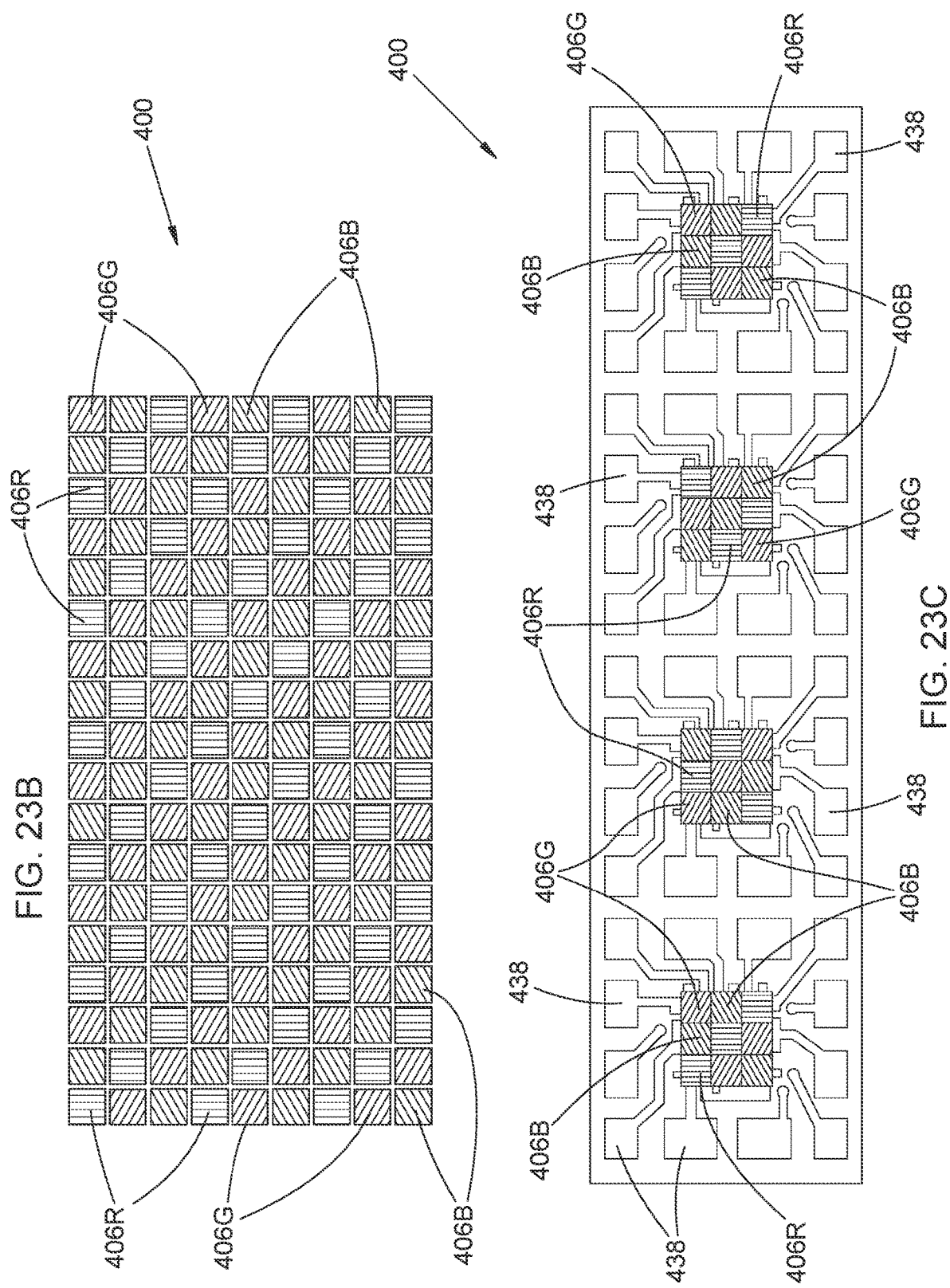

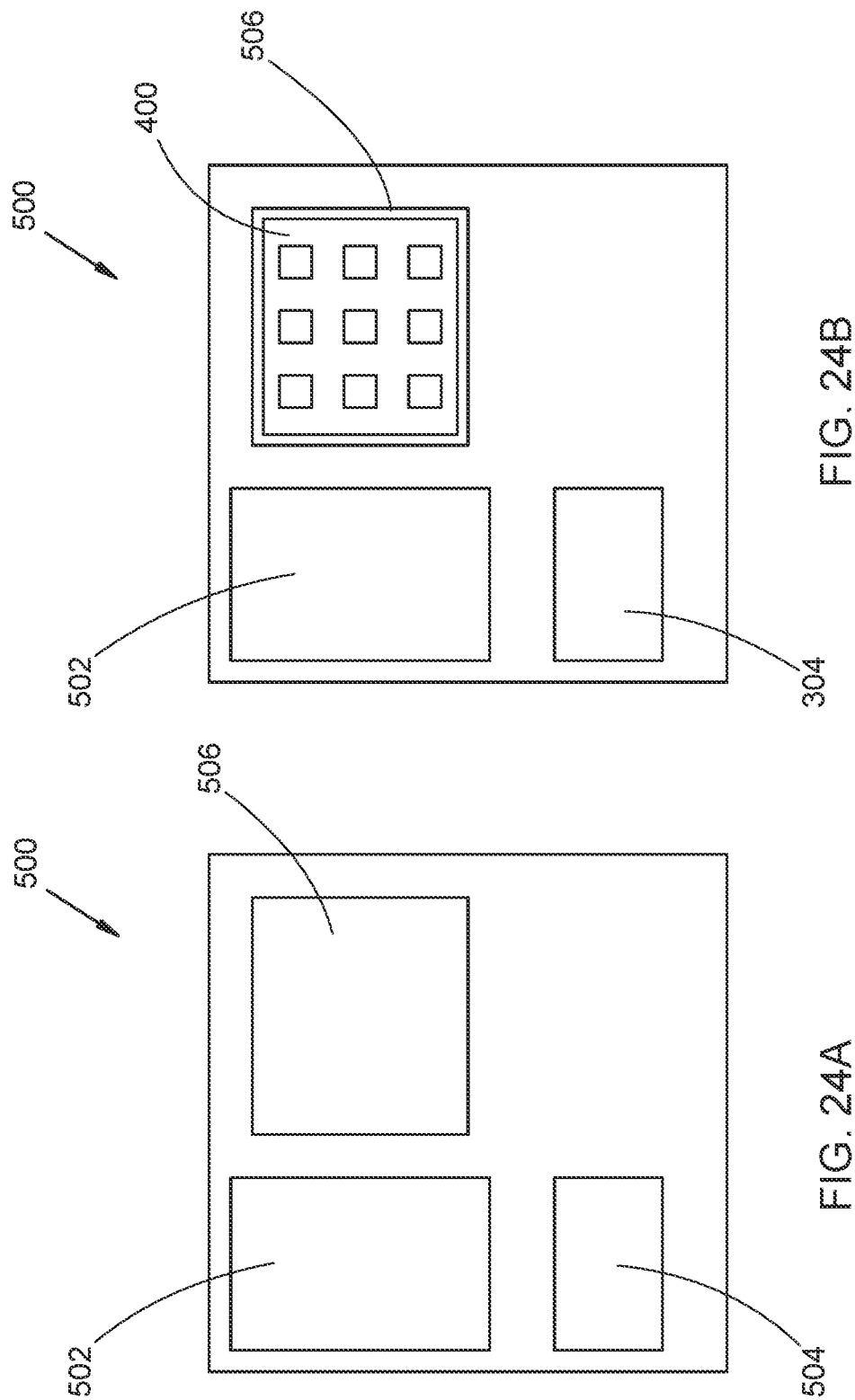

LIGHT-EMITTING DEVICE WITH INTERNAL NON-SPECULAR LIGHT REDIRECTION AND POSITION-DEPENDENT REFLECTION, TRANSMISSION, OR REDIRECTION

BENEFIT CLAIMS TO RELATED APPLICATIONS

This application claims benefit of U.S. provisional App. No. 63/197,648 entitled "Light-emitting device with internal non-specular light redirection and position-dependent reflection, transmission, or redirection" filed 7 Jun. 2021 in the names of Lopez et al, said provisional application being hereby incorporated by reference as if set forth herein in its entirety.

FIELD OF THE INVENTION

The field of the present invention relates to light-emitting devices. Devices are disclosed herein that include internal, non-specular light redirection and position-dependent reflection, transmission, or redirection to produce position-dependent luminance.

SUMMARY

An inventive semiconductor light-emitting device includes a semiconductor diode structure having front and back surfaces, one or more light-emitting active layers, and a redirection layer on the back surface. The one or more light-emitting active layers are arranged to emit output light at a nominal vacuum wavelength λ0 to propagate within the diode structure. The back-surface redirection layer includes one or more of (i) an array of nano-antennae, (ii) a partial photonic bandgap structure, (iii) a photonic crystal, or (iv) an array of meta-atoms or meta-molecules. At least a portion of the back-surface redirection layer is structurally arranged, relative to the nominal output vacuum wavelength $\lambda_0$, to exhibit non-specular internal reflective redirection of output light incident on the back surface within the diode structure. One or both of the front or back surfaces include one or more structural arrangements that exhibit position-dependent redirection, reflection, or transmission of the output light, including one or both of (i) at least a portion of the back-surface redirection layer exhibiting position-dependent internal reflective redirection of output light incident on the back surface within the diode structure, or (ii) the front surface including a layer or coating thereon, at least a portion of said front-surface layer or coating exhibiting position-dependent internal reflective redirection, or position-dependent transmissive redirection, of output light incident on the front surface from within the diode structure.

The position dependence of one or both of the back-surface redirection layer or the front-surface layer or coating can be arranged so that output light exiting the device through the front surface exhibits position-dependent luminance that varies with position across the front surface. In some instances the position dependence of luminance of the output light exiting the device through the front surface can differ from position dependence of emission of the output light emitted from the active layer. In some of those instances, with substantially uniform emission of output light across the active layer, output light exiting the device through the front surface can exhibit position-dependent luminance that varies with position across the front surface.

Objects and advantages pertaining to light-emitting devices may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 12A is a schematic cross-sectional view of an example of a light-emitting device. FIG. 12B illustrates schematically an example of non-specular reflective redirection of output light.

FIG. 13A is a schematic cross-sectional view of an example of a light-emitting device. FIG. 13B illustrates schematically an example of non-specular reflective redirection and non-refractive transmissive redirection of output light.

FIGS. 20A and 20B illustrate schematically an example of a phase function imparted by an example of a structured lens for a light-emitting device.

FIG. 21 illustrates schematically non-refractive transmissive redirection of light, by a portion of the front-surface coating or layer, to propagate at an angle less than the refracted angle.

FIGS. 22A and 22B illustrate schematically simulated angular intensity distributions for an array of light-emitting elements without and with non-refractive transmissive redirection, respectively.

LEDs of the array. FIG. 23B is a schematic top view of a portion of an example LED display in which each display pixel is a red, green, or blue phosphor-converted LED pixel. FIG. 23C is a schematic top view of a portion of an example LED display in which each display pixel includes multiple phosphor-converted LED pixels (red, green, and blue) integrated onto a single die that is bonded to a control circuit backplane.

FIG. 24A shows a schematic top view an example electronics board on which an array of pcLEDs may be mounted, and FIG. 24B similarly shows an example array of pcLEDs mounted on the electronic board of FIG. 24A.

The embodiments depicted are shown only schematically; all features may not be shown in full detail or in proper proportion; for clarity certain features or structures may be exaggerated or diminished relative to others or omitted entirely. The drawings should not be regarded as being to scale unless explicitly indicated as being to scale; in particular, the height, depth, or width of various elements often can be exaggerated relative to other elements or, e.g., the thickness of an underlying substrate or diode structure. The embodiments shown are only examples and should not be construed as limiting the scope of the present disclosure or appended claims.

DETAILED DESCRIPTION OF EMBODIMENTS

Typical light-emitting diodes (LEDs) include one or more light-emitting active layer within a semiconductor diode structure that emits light when driven by an electric current. The back surface of the semiconductor diode structure (and in some instances one or more or all side surfaces) typically includes a reflector that reflects light incident within the semiconductor diode structure to propagate toward the front surface of the diode structure (the front surface can also be referred to herein as the exit surface). Many semiconductor materials have relatively large refractive indices (often around 3 or more) which would result in a large fraction of the emitted light being trapped within the semiconductor diode structure by total internal reflection. In some conventional light-emitting diodes texturing (e.g., corrugations, bumps or dimples, or other surface features or roughness) is formed on or attached to the front, exit surface of the semiconductor diode structure. The back-surface reflector in such so-called cavity emitters ensures that nearly all light propagating within the semiconductor diode structure eventually is incident on the front surface. The front-surface texturing serves to spoil total internal reflection at least partly, allowing a portion of the emitted light to escape the semiconductor diode structure through the front surface as device output light, while redirecting other portions propagate to within the semiconductor diode structure in directions that differ from that of a specular reflection from a flat exit surface. Those redirected portions eventually reach the front surface again and have another opportunity to escape by transmission through the front surface. This light recirculation process continues, and each so-called "photon bounce" (i.e., each round trip back and forth between the front and back surfaces through the semiconductor diode structure) within the effective "LED cavity" formed by the back-surface reflector and the front-surface texturing increases the overall probability of that photon escaping through the front surface as device output light.

Figure 11A:
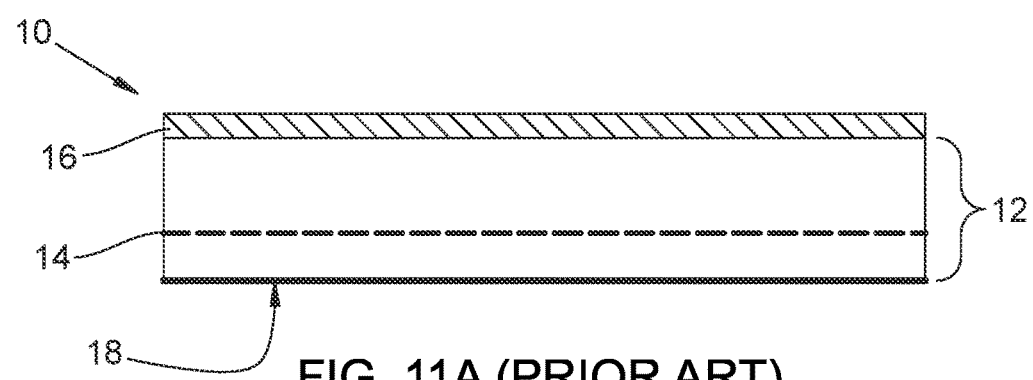
FIGS. 11A and 11B are schematic cross-sectional views of an example of a conventional light-emitting device.
Figure 11B:
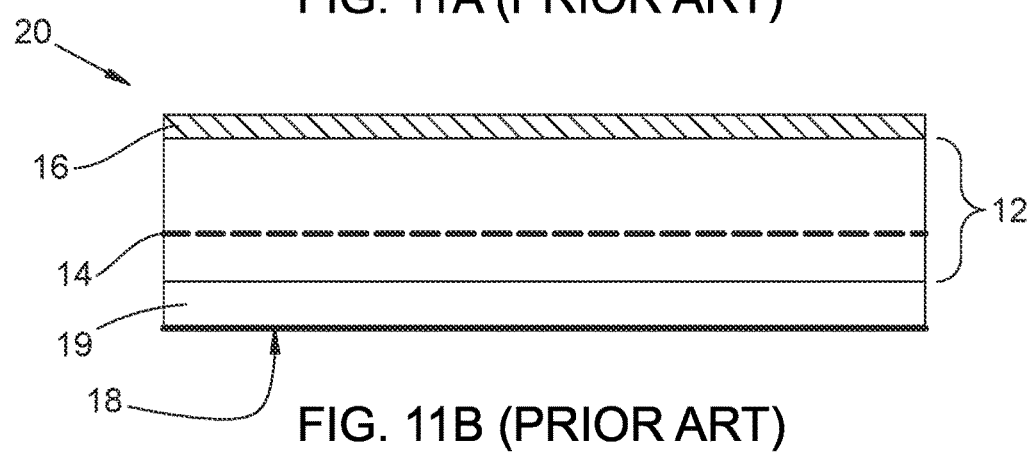

One example of a conventional LED cavity emitter 10 is illustrated schematically in FIG. 11A and includes a semiconductor diode structure 12, a light-emitting active layer 14 within the semiconductor diode structure 12, texturing 16 on the front surface of the semiconductor diode structure 12, and a reflector 18 on the back surface of the semiconductor diode structure 12. Another example of a conventional LED cavity emitter 20 is illustrated schematically in FIG. 11B and includes a semiconductor diode structure 12, a light-emitting active layer 14 within the semiconductor diode structure 12, texturing 16 on the front surface of the diode structure 12, a dielectric layer 19 on the back surface of the diode structure 12, and a reflector 18 on the back surface of the dielectric layer 19. In both FIGS. 11A and 11B, the reflector 18 exhibits only specular reflection.

The practical reality, however, is that the probability per bounce of a photon being transmitted through the front surface is relatively low, which in turn requires a relatively large number of round trips to achieve a sufficiently high probability of photon extraction (e.g., 10 to 50 bounces to achieve extraction efficiency approaching 90%, depending on the particular materials employed). That relatively high number of round trips or photon bounces in turn requires sufficiently low optical loss per round trip through the semiconductor diode structure (e.g., loss due to absorption by diode structure, active layer, or reflector materials, or insufficient reflectivity of the reflector). That low-loss requirement in some cases can drive up the cost or complexity of the light-emitting device (e.g.: use of a silver reflector instead of aluminum; use of a multi-layer thin film reflector instead of a metal reflector; or use of higher-purity materials for diode structure, active layer, or reflector), or result in devices with low extraction efficiency (e.g., if low-loss alternatives are unavailable or cost-prohibitive).

Therefore, it would be desirable to provide an inventive light-emitting device that exhibits a relatively high photon extraction efficiency (e.g., 80% or more) and a relatively reduced number of photon bounces (e.g., 30 or fewer). Several examples of LEDs exhibiting relative high photon extraction efficiency or reduced number of photon bounces are disclosed in U.S. non-provisional application. Ser. No. 17/121,014 entitled "Light-emitting device with internal non-specular light redirection and anti-reflective exit surface" filed Dec. 14, 2020 in the names of Antonio Lopez-Julia, Venkata Ananth Tamma, Aimi Abass, and Philipp Schneider, which is incorporated herein by reference as if set forth herein in its entirety.

One example of such an LED 100 is illustrated schematically in FIGS. 12A and 12B in which a back-surface redirection layer 108 and a front-surface anti-reflection coating 106 are employed on a diode structure 102 (including an active layer 104) to reduce the number of photon bounces and improve photon extraction efficiency provides non-specular reflective redirection. The redirection layer 108 is arranged to exhibit non-specular reflective redirection of light propagating outside an escape cone (e.g., at incidence angles within the diode structure 102 less than the critical angle $\Theta_C$ relative to the front and back surfaces, defined by the refractive indices of the diode structure 102 and an ambient medium 99 in contact with the front, exit surface) and redirects that light (e.g., as in FIG. 12B) to propagate within that escape cone and escape from the diode structure 102 by transmission through the front surface. The anti-reflection layer 106 on the front surface reduces the probability that a photon incident on the front surface within the escape cone will be reflected back into the diode structure 102 for another round trip. A second example of an LED 200 is illustrated schematically in FIGS. 13A and 13B, and includes specular reflective layer 112 and a transparent dielectric layer 110 between the redirection layer 108 and the reflective layer 112. In this example the redirection layer 108 exhibits both non-specular reflective redirection and non-refractive transmissive redirection (i.e., transmissive redirection that does not obey Snell's Law; e.g., as in FIG. 13B). Non-specular reflective redirection or non-refractive transmissive redirection can be achieved in some examples using one or more of (i) an array of nano-antennae, (ii) a partial photonic bandgap structure, (iii) a photonic crystal, or (iv) an array of meta-atoms or meta-molecules (each described further below).

Figure 14:
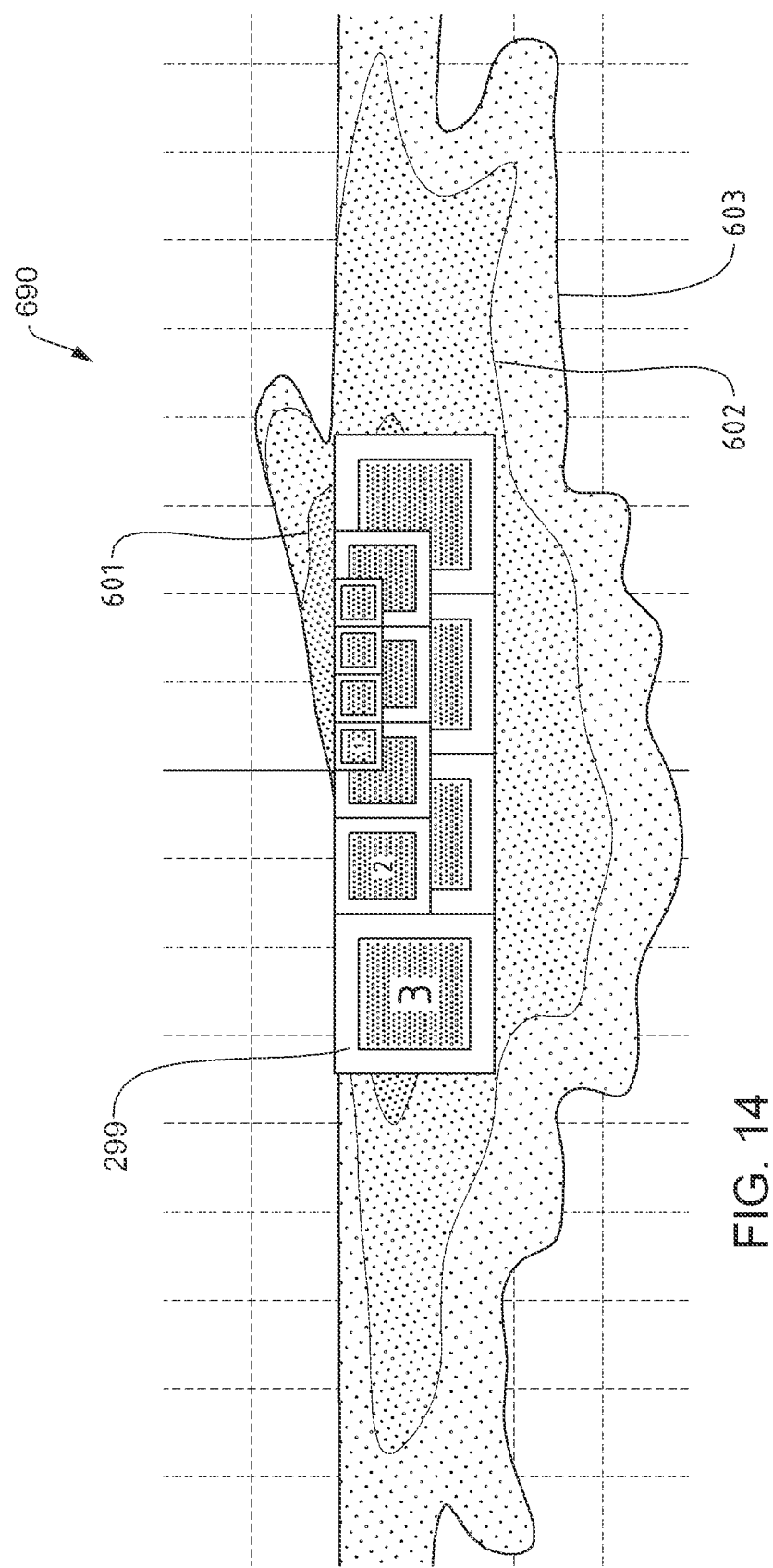
FIG. 14 shows a schematic diagram of an example of three differently scaled images of an example array of four light-emitting devices, and a corresponding intensity distribution of the image; the images are formed in a Fourier plane.

Employed in a vehicular headlight, headlight optics (in many instances reflective) are usually adapted to transform light emitted from one or more lighting devices by superimposing multiple images of the one or more lighting devices within a corresponding Fourier plane. FIG. 14 shows an example where three images 299 ("1", "2" and "3") of a row including four light-emitting devices are superimposed by suitable imaging optics in the Fourier plane defined by the headlight optics. For illustrative purpose, images of the light-emitting devices are shown scaled in accordance with a corresponding magnification of the corresponding optics on top of an example image intensity distribution 690 within the Fourier plane. In the figure, regions of the image intensity distribution 690 are indicated with decreasing intensity from region 601 to region 604 (a magnitude of corresponding intensity indicated by a density of black dots in the figure). A desirable light source for a vehicular headlight should enable light imaged by the headlight optics (i.e., an intensity profile formed within a Fourier plane defined by the optics) to be concentrated along a single direction with only little intensity emitted in other directions to avoid disturbing oncoming traffic.

Figure 15A:
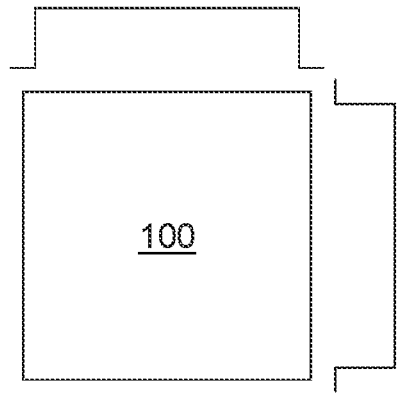
FIGS. 15A-15E show uniform, sloped, 1D-peaked, 2D-peaked, and concentrated position-dependent luminance for a single light-emitting device.
Figure 15B:
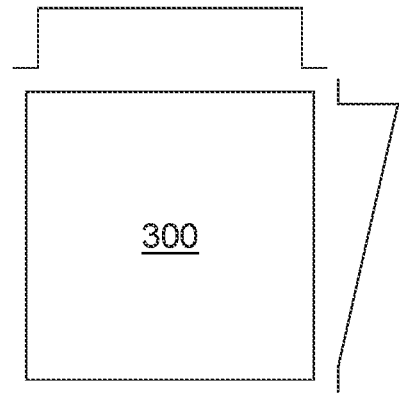
Figure 15C:
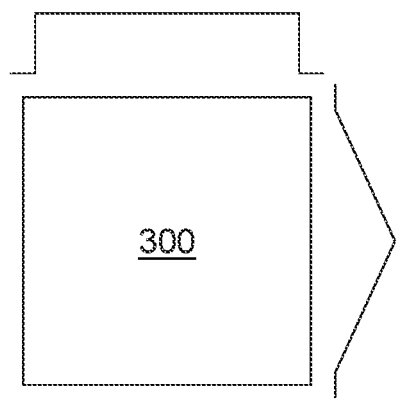
Figure 15D:
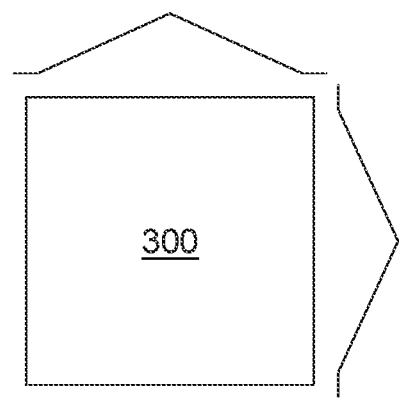
Figure 15E:
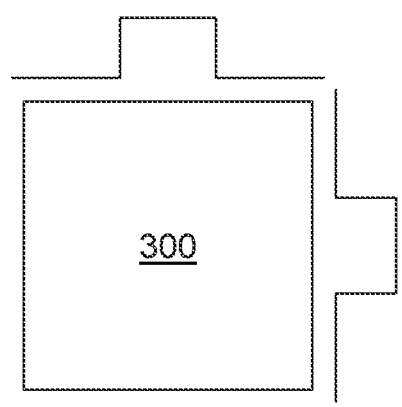

FIGS. 15A-15E show examples of device output intensity distributions (i.e., position-dependent luminance) that can be employed in the arrangement of FIG. 14. The example distribution of FIG. 15A has substantially uniform luminance across each light-emitting device 100. The example distribution of FIG. 15B is a so-called sloped distribution, with a position-dependent luminance that has a maximum near one edge of the device 300 and decreases monotonically toward the opposite edge. The example distribution of FIG. 15C is a so-called 1D-peaked distribution, with a position-dependent luminance that has a maximum along a line across the middle of the device 300 and decreases monotonically along one dimension toward both opposing edges. The example distribution of FIG. 15D is a so-called 2D-peaked distribution, with a position-dependent luminance that has a maximum in a central region of the device 300 and decreases along both dimensions toward all of the edges. The example distribution of FIG. 15E is a so-called concentrated distribution, with a position-dependent luminance that is substantially negligible over peripheral areas of the device 300 and substantially uniform over a central region of the device 300 (i.e., essentially a reduced-size, higher-luminance replica of a uniform distribution).

Figure 16A:
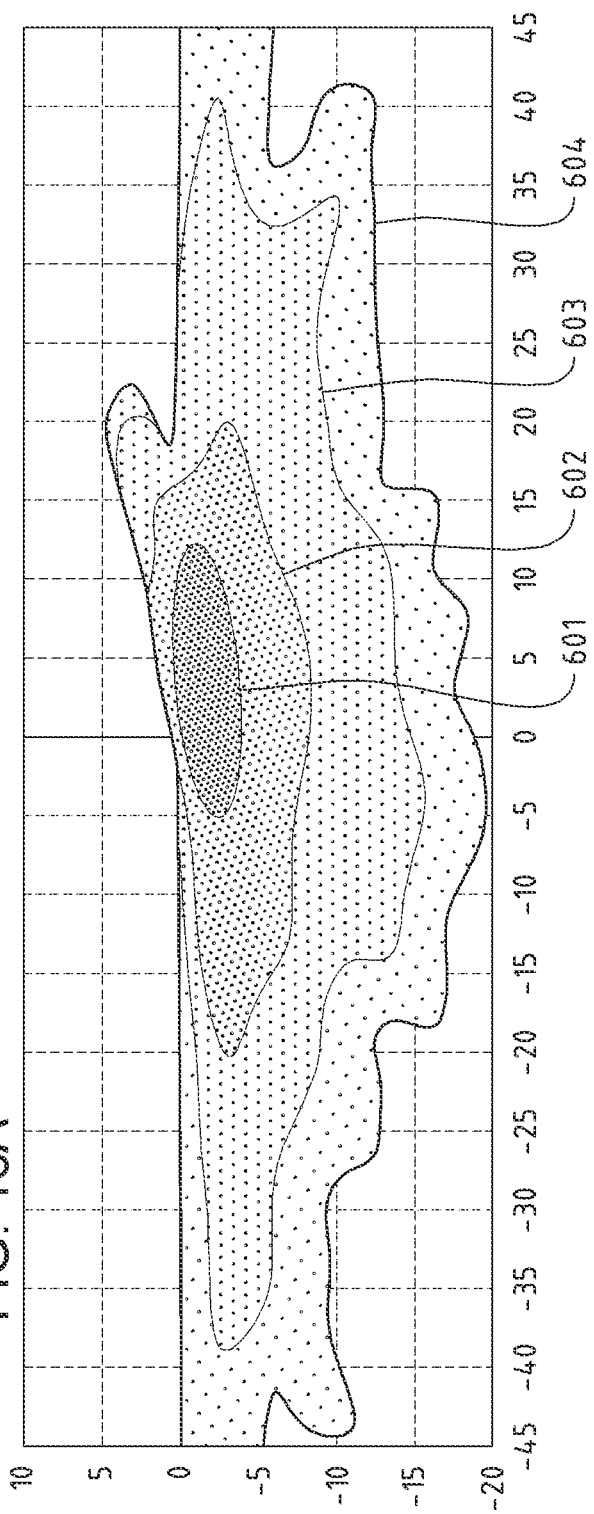
FIG. 16A shows an example image intensity distribution within a Fourier plane of an array of light-emitting devices having the output intensity distribution shown in FIG. 16B (e.g., similar to FIG. 15A) when imaged as in FIG. 14.
Figure 16B:
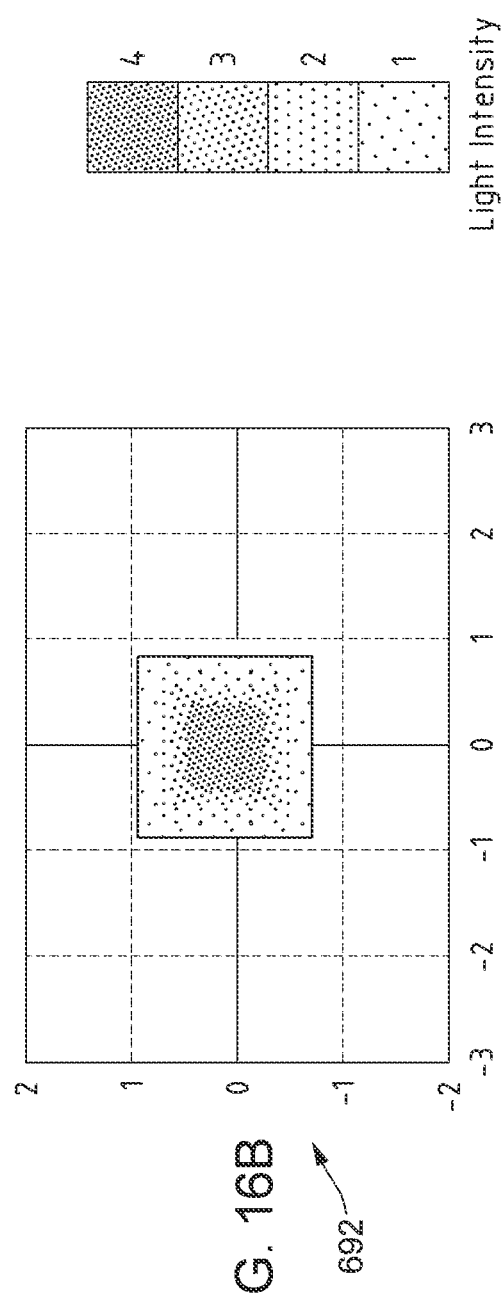
Figure 17A:
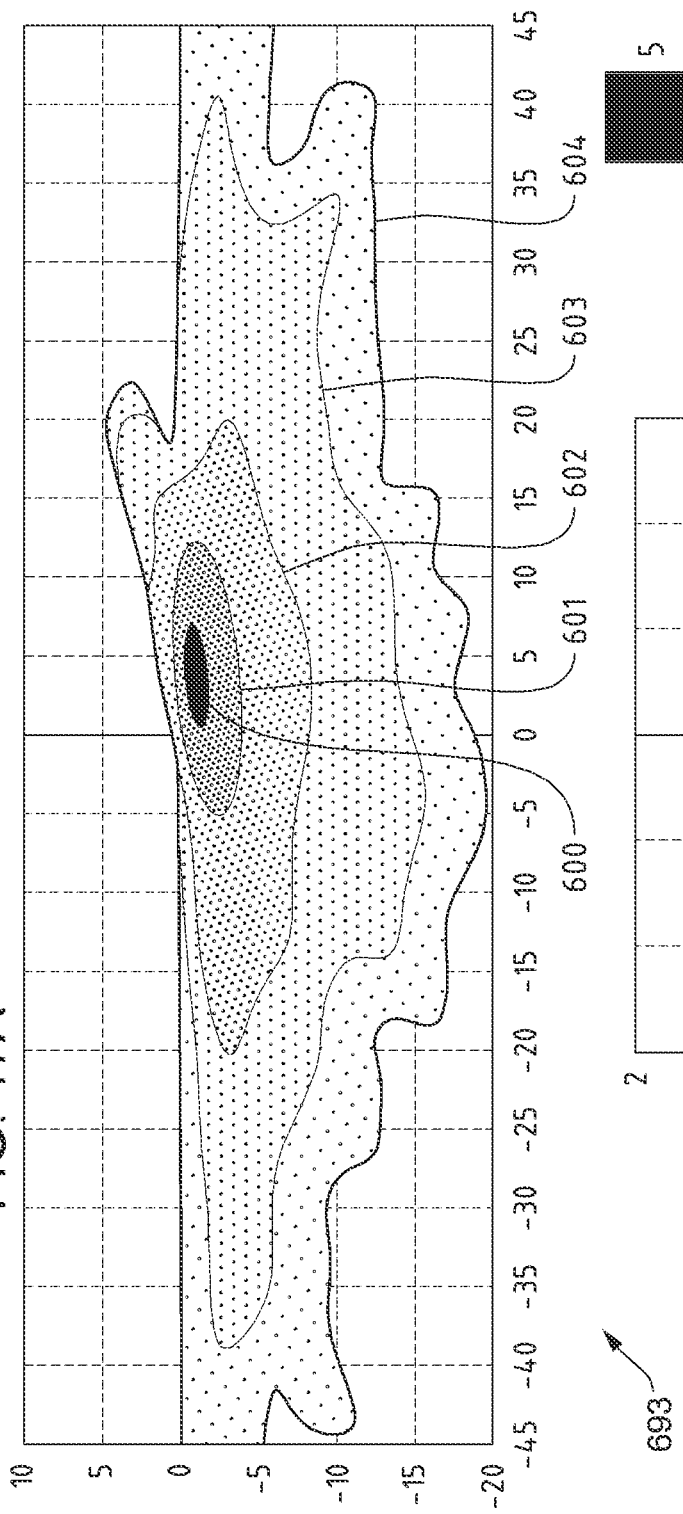
FIG. 17A shows an example image intensity distribution within a Fourier plane of an array of light-emitting devices having the output intensity distribution shown in FIG. 17B (e.g., similar to FIG. 15B) when imaged as in FIG. 14.
Figure 17B:
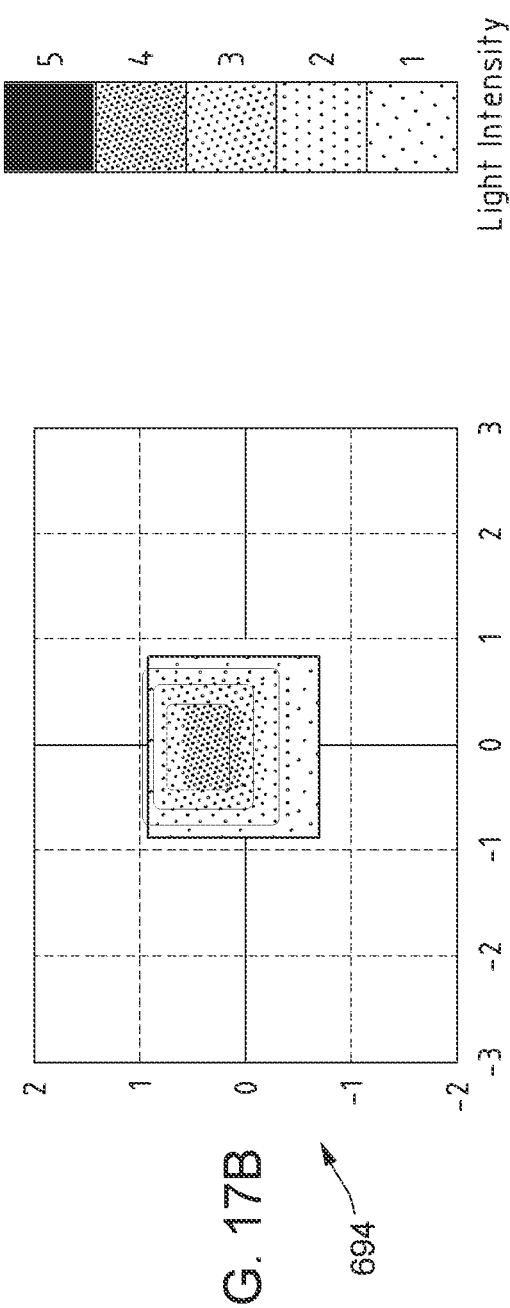
Figure 18A:
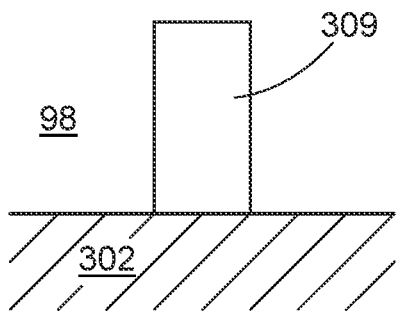
FIGS. 18A-18D illustrate schematically several examples of nano-antennae.
Figure 18B:
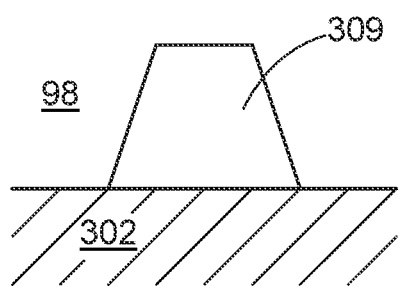
Figure 18C:
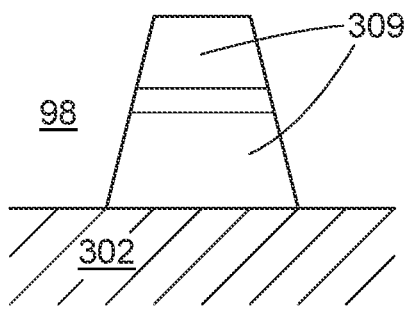
Figure 18D:
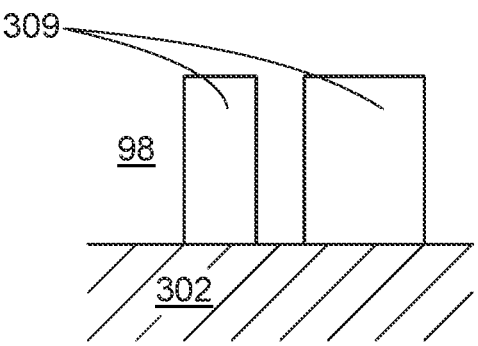

FIG. 16A is an imaged intensity distribution 691 (with contour lines 601/602/603/604) arising from a row of four light-emitting devices 100 imaged according to the arrangement of FIG. 14; each device 199 has the position-dependent luminance 692 shown in FIG. 16B, i.e., substantially uniform luminance as in FIG. 15A. FIG. 17A is an imaged intensity distribution 693 (with contour lines 600/601/602/603/604) arising from a row of four light-emitting devices 300 imaged according to the arrangement of FIG. 14; each device 300 has the position-dependent luminance 694 shown in FIG. 17B, i.e., a sloped distribution as in FIG. 15B. The imaged distribution 693 of FIG. 17A is more strongly peaked along the desired direction than the distribution 691 of FIG. 16A. Therefore it may be desirable in some instances (e.g., certain automotive headlight assemblies that include reflective optics) to provide light sources 300 that can provide a sloped position-dependent luminance similar to that of FIG. 15B. In another example, some high-beam automotive headlights are observed to exhibit desirable beam intensity profiles when employing LEDs with 2D-peaked position-dependent luminance as in FIG. 15D. The position-dependent luminance of any one of FIGS. 15B-15E can be advantageously employed in various use applications, including automotive and non-automotive applications.

In some previous light-emitting devices, position-dependent luminance (e.g., as in FIGS. 15B-15D) is achieved by driving the LED with position-dependent current density. In some examples, spatial density of current-carrying vias is varied across the LED to yield the desired position-dependent current density. In other examples, differing currents are delivered through different vias of the LED to yield the desired position-dependent current density. Some examples are disclosed in, e.g., (i) U.S. non-provisional application. Ser. No. 16/875,237 entitled "Light-emitting device with configurable spatial distribution of emission intensity" filed May 15, 2020 in the names of Toni Lopez and Floris Crompvoets, and (ii) U.S. non-provisional application Ser. No. 17/142,960 entitled "Light-emitting device with internal non-specular light redirection and anti-reflective exit surface" filed Jan. 6, 2021 in the names of Toni Lopez and Floris Crompvoets. Both of said applications are incorporated by reference as if set forth herein in their entireties.

Driving the LED with position-dependent current density can yield corresponding position-dependent luminance. However, during that manner of operation certain areas of the LED necessarily are driven with less than maximal current density to yield less than maximal local luminance. In effect, some of the light-producing capacity of the LED die is wasted, because the LED is not driven at maximal current density across its entire area. If position-dependent luminance could be achieved while driving the entire area of the LED at maximum current density, then overall light output of the LED could be increased.

For purposes of the present disclosure and appended claims, "incidence angle" and "angle of incidence" of light incident on a surface or interface refers to the angle between the propagation direction of the incident light and a vector normal to the surface or interface. Accordingly, light propagating at normal incidence with respect to a surface would have an incidence angle of 0°, while light propagating near grazing incidence with respect to that surface would have an incidence angle approaching 90°. For purposes of the present disclosure and appended claims, the "critical angle" for light incident on a surface or interface between media of differing refractive indices refers to the incidence angle, for light propagating within the higher index medium, above which the light undergoes total internal reflection within the higher-index medium. For purposes of the present disclosure and appended claims, "oblique light" or "oblique radiation" shall refer to light propagating within a substrate or diode structure at incidence angles greater than $\Theta_C$ with respect to the front and back surfaces thereof, while "perpendicular light" or "perpendicular radiation" shall refer to light propagating within a substrate or diode structure at incidence angles less than $\Theta_C$ with respect to those surfaces, even if not literally perpendicular; "normal" shall be reserved for light incident at an incidence angle of 90°. For purposes of the present disclosure and appended claims, any arrangement of a layer, surface, substrate, diode structure, or other structure "on," "over," or "against" another such structure shall encompass arrangements with direct contact between the two structures as well as arrangements including some intervening structure between them. Conversely, any arrangement of a layer, surface, substrate, diode structure, or other structure "directly on," "directly over," or "directly against" another such structure shall encompass only arrangements with direct contact between the two structures.

An inventive semiconductor light-emitting device 300 includes a semiconductor diode structure 302 and a redirection layer 308 on the back surface of the diode structure 302. The semiconductor diode structure 302 has front and back surfaces and one or more light-emitting active layers 304 (e.g., one or more quantum well layers) within the diode structure 302. The active layer(s) 304 are arranged to emit output light at a nominal vacuum wavelength $\lambda_O$ to propagate within the diode structure 302. "At a nominal vacuum wavelength $\lambda_O$" means that the wavelength spectrum of the device output light includes a range of wavelengths that includes $\lambda_O$. In many examples the device output light is within about ±5 nm or about ±10 nm of $\lambda_O$; in other examples the spectral width of the device output light can be greater than that. In many typical examples the semiconductor diode structure 302 can include reflective coatings on one or more or all lateral surfaces thereof; those lateral reflective coatings can be of any suitable type or arrangement, and act to reflect any output light incident thereon within the semiconductor diode structure 302. The redirection layer 308 includes one or more of (i) an array of nano-antennae, (ii) a partial photonic bandgap structure, (iii) a photonic crystal, or (iv) an array of meta-atoms or meta-molecules (described further below). At least a portion of the back-surface redirection layer 308 is structurally arranged, relative to the nominal output vacuum wavelength $\lambda_O$, to exhibit non-specular internal reflective redirection of output light incident on the back surface within the diode structure 302 (e.g., similar to redirection layer 108 in FIG. 12B).

Figure 1:
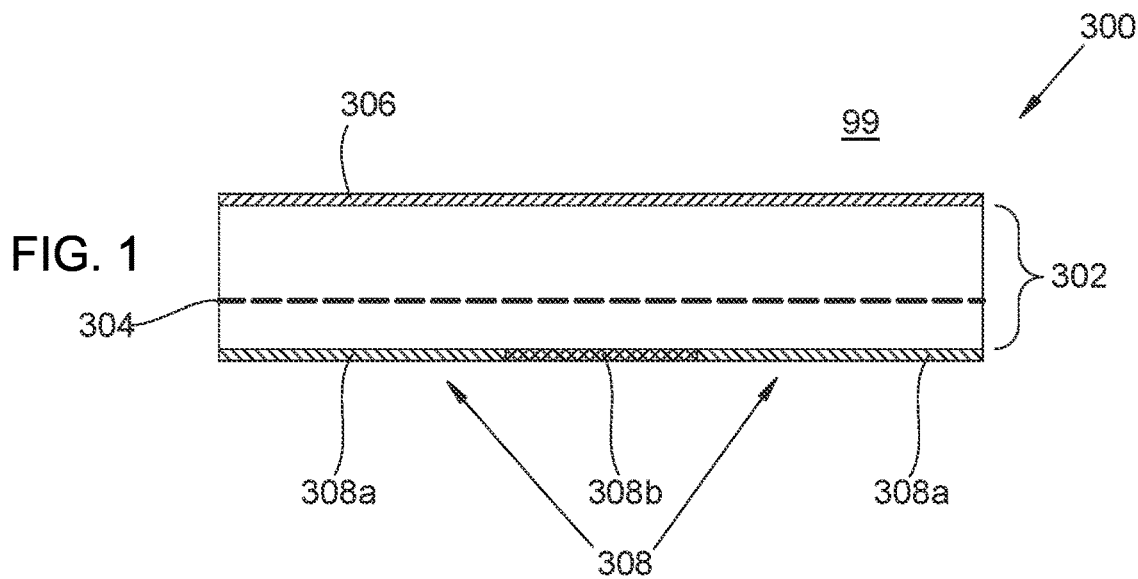
FIGS. 1, 2, and 3 are schematic cross-sectional views of three examples of inventive light-emitting devices.

One or both of the front or back surfaces of the diode structure 302 include one or more structural arrangements that exhibit position-dependent redirection, reflection, or transmission of the output light. In the example of FIG. 1, those structural arrangements include at least a portion of the back-surface redirection layer 308 being structurally arranged to exhibit position-dependent internal reflective redirection of output light incident on the back surface within the diode structure 302. In the example shown, the regions 308a of the redirection layer 308 can exhibit, e.g., non-specular reflective redirection of the output light incident within the diode structure 302, while the region 308b exhibits, e.g., non-specular reflective redirection (at a different angle than the regions 308a) or specular reflective redirection (i.e., specular reflection) of output light incident within the diode structure 302. In other examples more than two differently arranged regions of the redirection layer 308 can be employed, or the redirection can exhibit a gradient of its redirection behavior across the LED 300. In the example of FIG. 1 the front surface of the diode structure 302 can include a front-surface coating or layer 306 that is arranged as, e.g., as a refractive or non-refractive transmissive redirection layer, in some instances including an anti-reflection coating over the entire front surface; the redirection behavior of the front-surface coating or layer 306 is substantially constant across the front surface of the diode structure 302. The non-specular reflective redirection of output light by at least portions of the back-surface redirection layer 308, and anti-reflective properties (if present) of the front-surface coating or layer 306, can result in a reduced average number of photon bounces within the diode structure 302 (as described previously). The position dependence of the reflective redirection by the back-surface redirection layer 308 can result in the desired position-dependent luminance at the front, output surface of the diode structure 302 (including, e.g., the position-dependent luminance of any of the examples of FIGS. 15B-15E).

Figure 2:
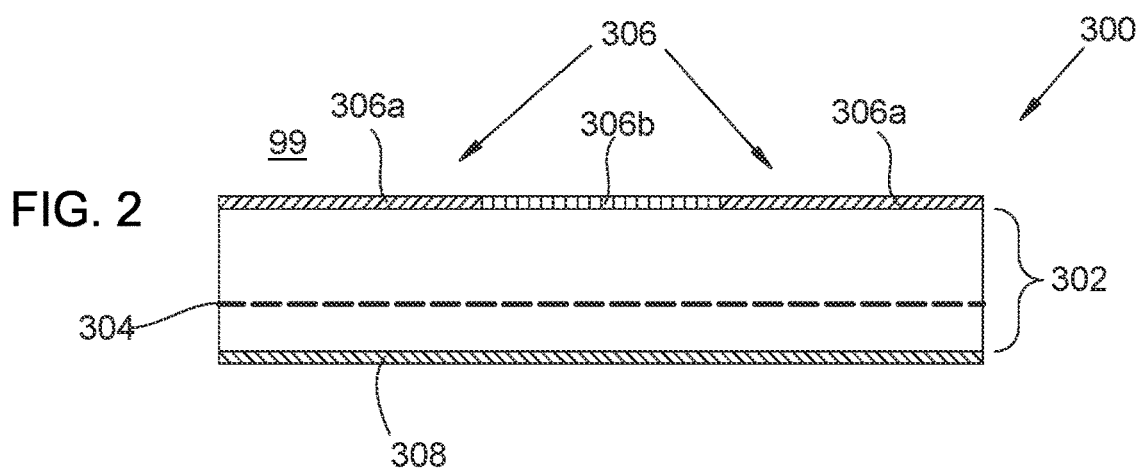

In the example of FIG. 2, the structural arrangements of the front and back surfaces include at least a portion of the front-surface coating or layer 306 being structurally arranged to exhibit position-dependent internal reflective redirection, or position-dependent transmissive redirection, of output light incident on the front surface from within the diode structure 302. In the example shown, the regions 306a of the front-surface coating or layer 306 can exhibit, e.g., specular or non-specular reflective redirection of the output light incident within the diode structure 302, while the region 306b exhibits, e.g., refractive or non-refractive transmission of output light incident within the diode structure 302. In other examples more than two differently arranged regions of the front-surface coating or layer 306 can be employed, or the redirection can exhibit a gradient of its redirection behavior across the LED 300. In the example of FIG. 2 the back-surface redirection layer 308 can be arranged so that its redirection behavior is substantially constant across the back surface of the diode structure 302. The non-specular reflective redirection of output light by the back-surface redirection layer 308, and at least portions of front-surface layer or coating 306, and anti-reflective behavior (if present) of other portions of the front-surface layer or coating 306, can result in a reduced average number of photon bounces within the diode structure 302 (as described previously). The reflective redirection by the back-surface redirection layer 308 and the position dependence of the front-surface layer or coating 306 can result in the desired position-dependent luminance at the front, output surface of the diode structure 302 (including, e.g., the position-dependent luminance of any of the examples of FIGS. 15B-15E).

Figure 3:
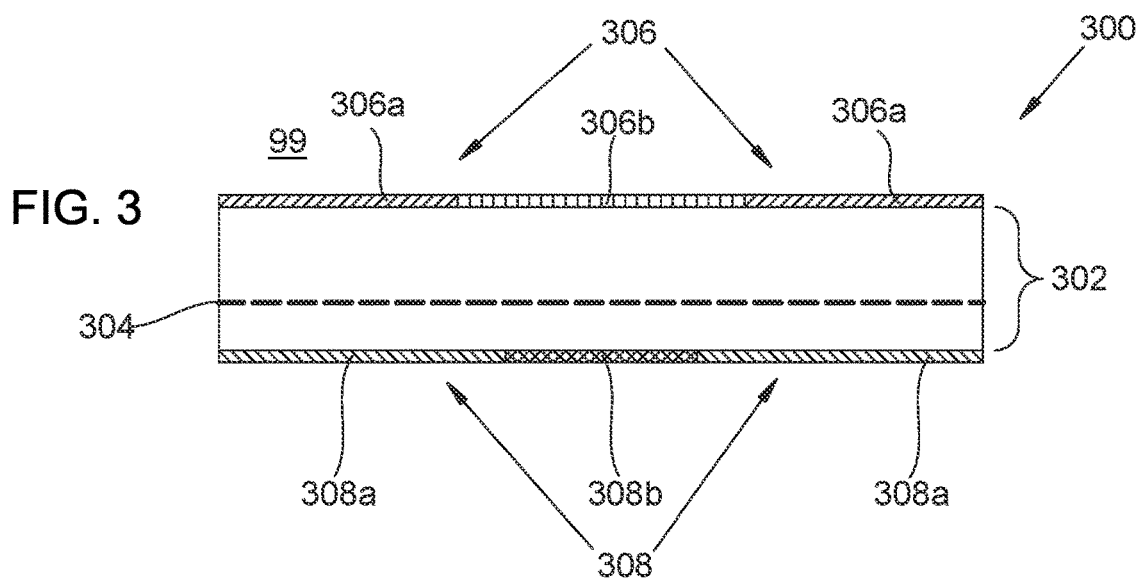
Figure 4:
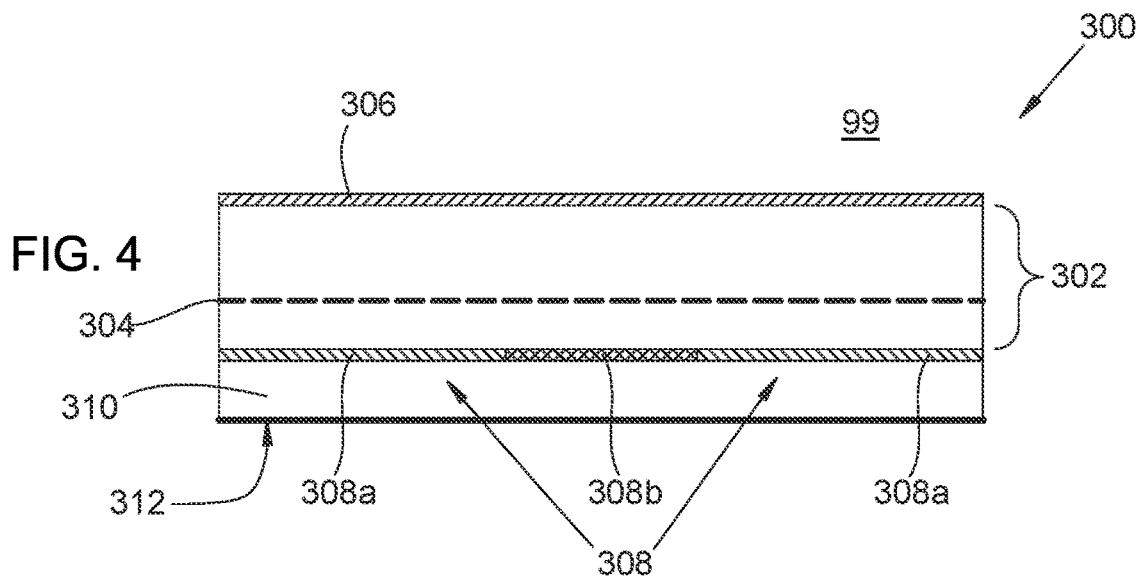
FIGS. 4, 5, and 6 are schematic cross-sectional views of three more examples of inventive light-emitting devices.
Figure 5:
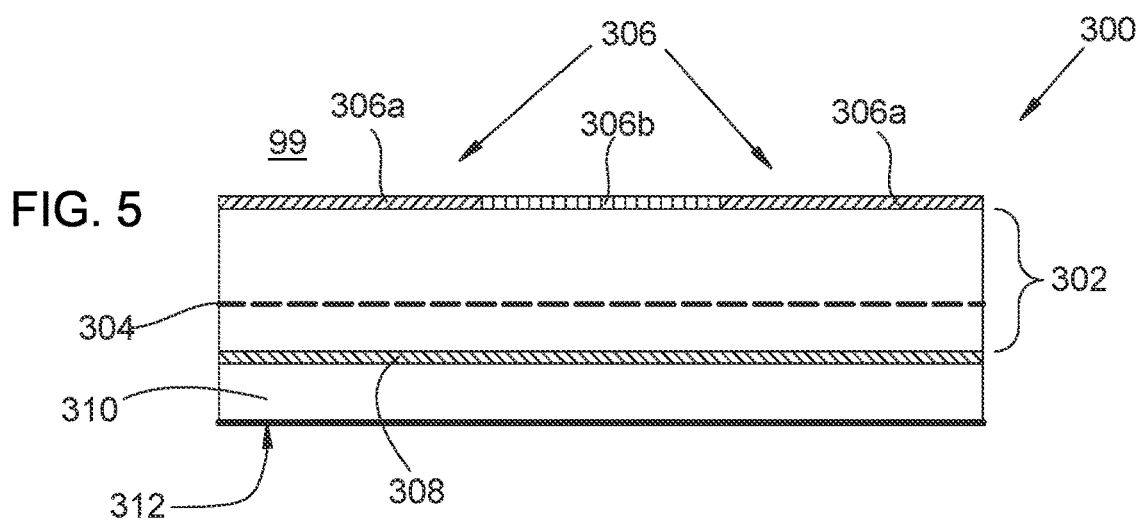
Figure 6:
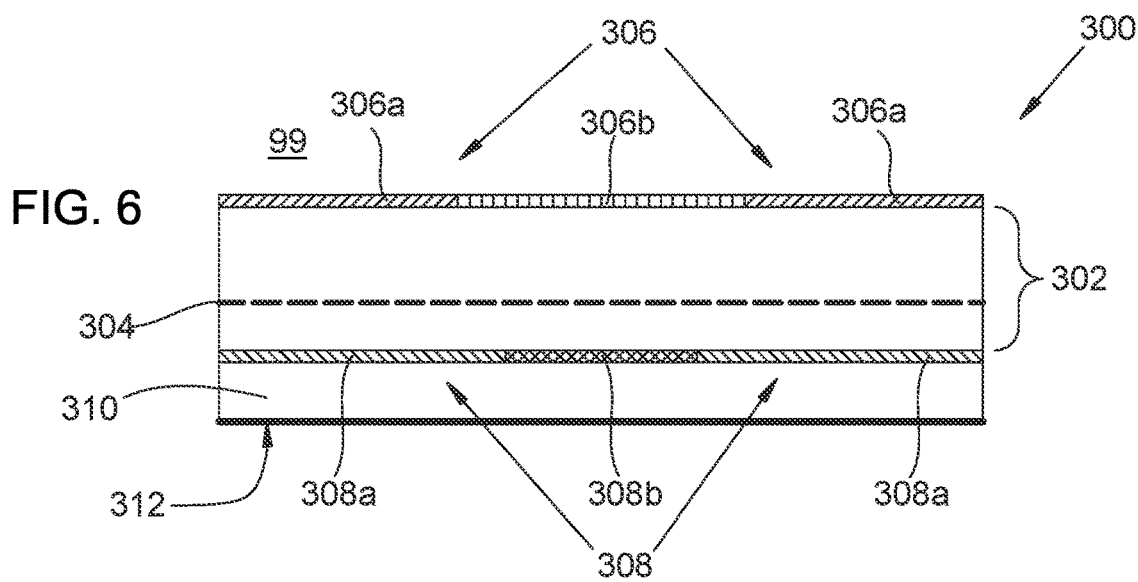

In the example of FIG. 3, both of the back-surface redirection layer 308 and the front-surface layer or coating 306 exhibit position-dependent optical behaviors, e.g., such as those described above. The examples of FIGS. 4, 5, and 6 are analogous to those of FIGS. 1,2, and 3, respectively, with the addition of a back-side reflector 312 (e.g., metal or dielectric multilayer or any suitable type) and a substantially transparent dielectric layer 310 between the redirection layer 308 and the reflector 312. In those latter examples, the redirection layer 308, or at least regions thereof, can exhibit transmissive redirection of output light propagating within the diode structure 302 (e.g., analogous to the arrangement of FIG. 13B).

In the example arrangements of FIGS. 1-6, position-dependences of reflective redirection of one or both of the front- and back-surface layers 306 and 308 are arranged to direct output light within the diode structure 302 to desired regions of the front surface of the diode structure, to achieve the desired position-dependent luminance (e.g., such as those shown in FIGS. 15B-15E), and also to direct a sufficiently large fraction of that light to be incident on those regions within the escape cone. In some examples the regions of the front-surface coating or layer 306 where the output light exits the diode structure 302 can be arranged to reduce the probability that light would be reflected back into the diode structure 302; in some examples the regions of the front-surface coating or layer 306 where the output light exits the diode structure 302 can be arranged to redirect non-refractively the output light exiting the diode structure 302 to propagate in a desired angular distribution or with desired convergence, collimation, or divergence (e.g., as in FIGS. 19A-22B).

Position dependences of one or both of the back-surface redirection layer 308 or the front-surface layer or coating 306 can result in output light exiting the diode structure 302 through the front surface exhibiting a position-dependent luminance that varies with position across the front surface. In some examples, the position dependence of the luminance of the output light exiting the diode structure 302 through the front surface differs from position dependence of emission of the output light emitted from the active layer 304. In some of those examples, with substantially uniform emission of output light across the active layer 304, output light exiting the diode structure 302 through the front surface exhibits position-dependent luminance that varies with position across the front surface.

Figure 7:
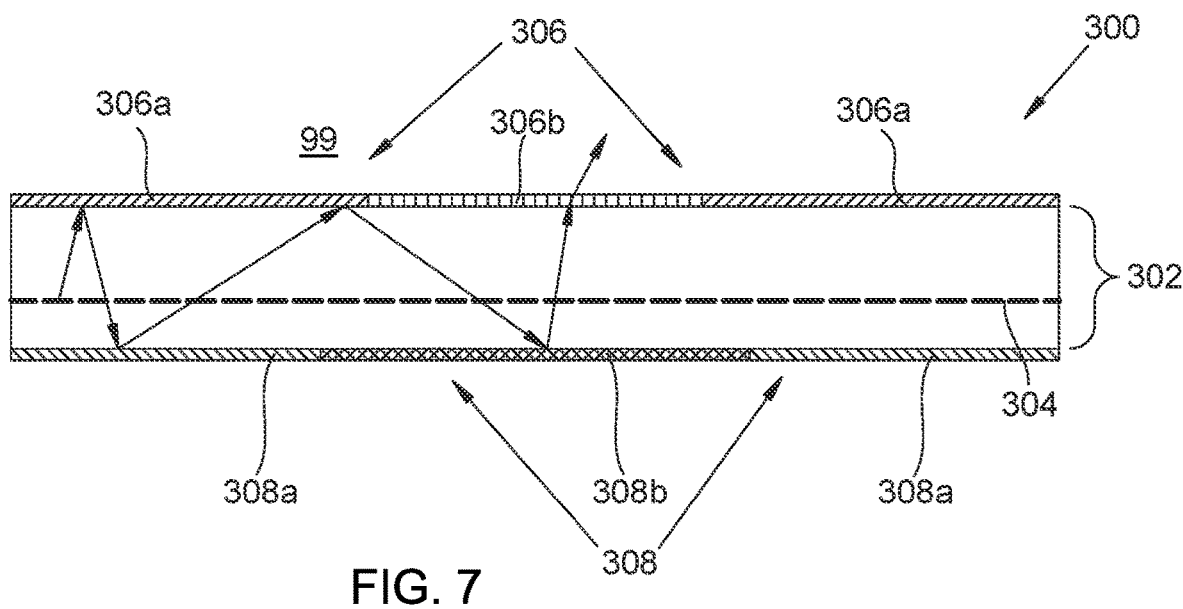
FIG. 7 is a schematic cross-sectional view of another example of an inventive light-emitting device.

In the specific example of FIG. 7, the peripheral regions 306a are arranged for specular reflection (e.g., as a distributed Bragg reflector or DBR, or as a metallic coating), the central region 306b includes an anti-reflection coating, the peripheral regions 308a redirect perpendicular light to propagate as oblique light, and the central region 308b redirects oblique light to propagate as perpendicular light. Some output emitted from a central region of the active layer 304 can exit the device directly through the coating 306b, or perhaps after one redirection by the redirection layer 308. Most output light emitted by the active layer 304 will be redirected or reflected by the regions 308a/308b and 306a a number of times before exiting through the region 306b. The net result of the arrangement of those regions is redirection of light emitted over the entire area of the active layer 304 to exit the device 300 through only the central region 306b on the front surface. That arrangement can yield a concentrated distribution of the position-dependent luminance (e.g., as in FIG. 15E); luminance of the device 300 is increased by reduction of the area of the front surface through which light emitted from the entire area of the active layer 304 exits the device 300. The arrangement of the layer regions 306a/306b/308a/308b also can result in increased photon extraction efficiency or reduce mean number of photon bounces before exiting the diode structure 302.

Figure 8:
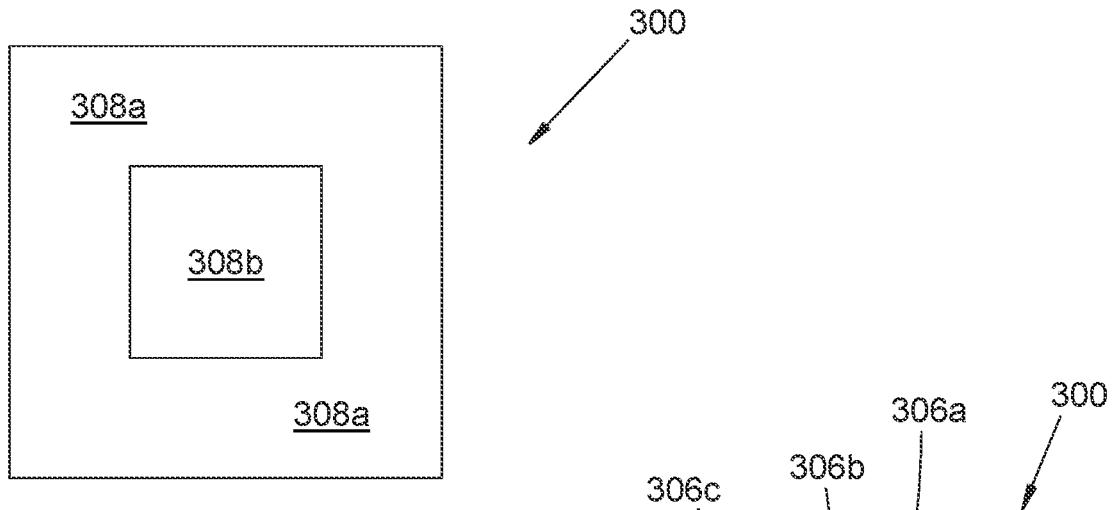
FIGS. 8, 9, and 10 are schematic plan views of several example arrangements of redirection layers of an inventive light-emitting device.
Figure 9:
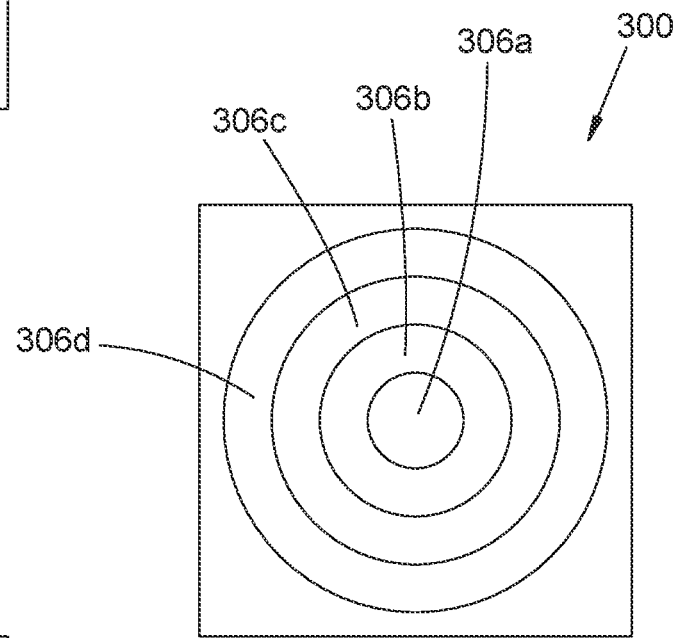
Figure 10:
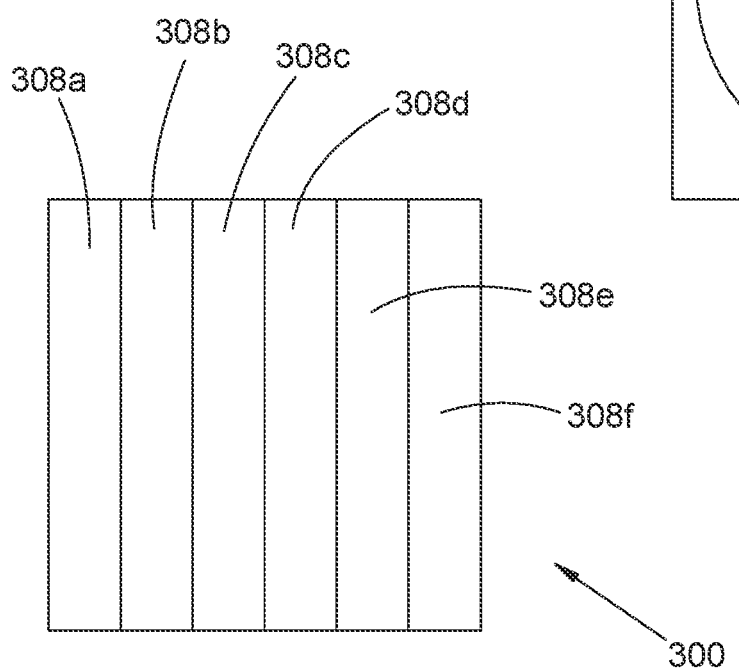

Several example arrangements of different regions of the back-surface redirection layer 308 or the front-surface layer or coating 306 are illustrated schematically in FIGS. 8-10. Although each shows and arrangement of only one of the layers 306 or 308, each arrangement can be applied to either or both of layers 306 or 308. In FIG. 8, a square or rectangular central region 308b is surrounded by a peripheral region 308a. In some examples such an arrangement of regions can result in position-dependent luminance that resembles, e.g., the 2D-peaked distribution of FIG. 15D or the concentrated distribution of FIG. 15E (rectangular). FIG. 9 shows a set of concentric circular regions 306a, 306b, 306c, and 306d. In some examples such an arrangement of regions can result in, e.g., the 2D-peaked distribution of FIG. 15D or the concentrated distribution of FIG. 15E (circular), or can result in altered collimation, convergence, divergence, or angular distribution of the exiting output light, e.g., as in one or more of FIGS. 19A-22B (described in more detail below). FIG. 10 shows a set of rectangular regions 308a-308f arranged across the device 300. In some examples such an arrangement of regions can result in, e.g., the sloped distribution of FIG. 15B or the 1D-peaked distribution of FIG. 15C. Other numbers or arrangements of regions 306a/306b/306c/ . . . or regions 308a/308b/308c/ . . . can be employed (e.g., checkerboard, hexagonal, and so forth). In any arrangement of regions, including those shown in the drawings, each region can exhibit optical reflective, transmissive, or redirective properties that are substantially constant across that region but differ from adjacent regions (e.g., reflective versus transmissive, specular versus non-specular, refractive versus non-refractive, differing angles of reflective or transmissive redirection, and so forth). Instead or in addition, one or more regions can exhibit a gradient of optical reflective, transmissive, or redirective properties.

Figure 23A:
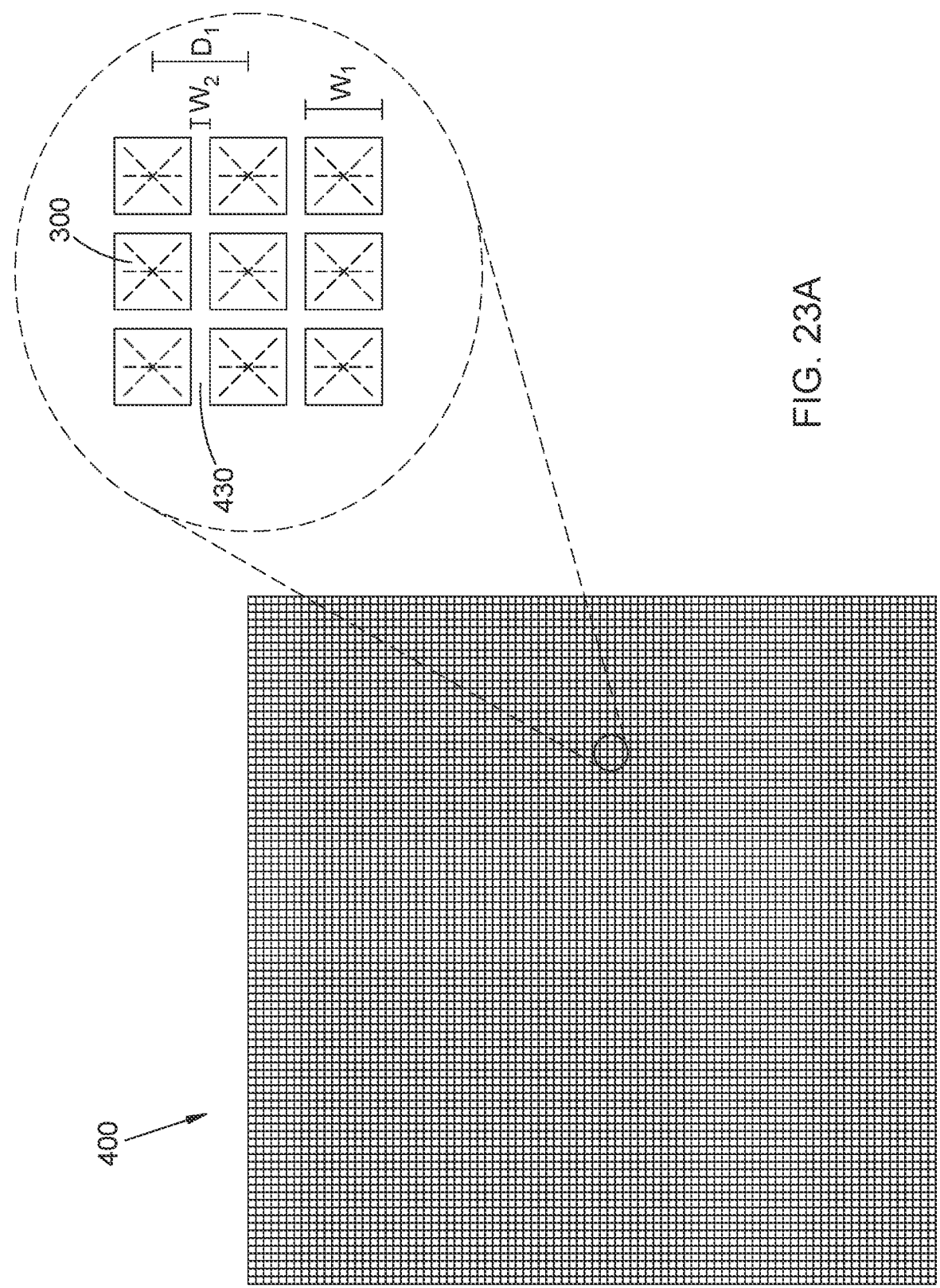
FIG. 23A shows a top schematic view of an example miniLED or microLED array and an enlarged section of 3×3

In some examples the front surface of the semiconductor diode structure 302 is positioned against an ambient medium 99 that is vacuum, air, a gaseous medium, or a liquid medium. In some examples the ambient medium 99 includes one or more substantially solid materials among: doped or undoped silicone, or one or more doped or undoped polymers. In some examples the ambient medium 99 can be a wavelength-converting material (i.e., a phosphor; e.g., red, green, and blue phosphors 406R/406G/406B shown in FIGS. 23B and 23C) that absorbs at least a portion of the output light at the vacuum wavelength $\lambda_0$ and emits down-converted light at one or more vacuum wavelengths longer than $\lambda_0$. In some examples the ambient medium 99 can be interposed between a wavelength-converting material and the front surface of the diode structure 302. In some examples the nominal output vacuum wavelength $\lambda_0$ is larger than about 0.20 μm, larger than about 0.4 μm, larger than about 0.8 μm, smaller than about 10. μm, smaller than about 2.5 μm, or smaller than about 1.0 μm. In some examples the light-emitting device 300 comprises a light-emitting diode. In some examples the semiconductor diode structure 302 or active layer 304 includes one or more doped or undoped II-VI, or Group IV semiconductor materials or alloys or mixtures thereof. Note that the semiconductor diode structure 302 and active layer(s) 304 typically are formed together by a process sequence, often with the active layer(s) 304 formed on a surface of an initial semiconductor layer or substrate and then additional semiconductor material deposited over the active layers; other suitable fabrication sequences can be employed. In some examples the light-emitting layer 304 includes one or more doped or undoped II-VI, or Group IV semiconductor materials or alloys or mixtures thereof. In some examples the light-emitting layer 304 includes one or more p-n junctions, one or more quantum wells, one or more multi-quantum wells, or one or more quantum dots. The light emitting device 300 typically includes one or more electrodes (not shown) for delivering electric current to the active layer 304 to produce the output light.

For light at the nominal vacuum wavelength $\lambda_0$ that is incident on the front surface within the semiconductor diode structure 302 at an incidence angle less than $\Theta_C$ (i.e., for perpendicular light, or equivalently, light within the escape cone), any anti-reflection coating on the front surface (or portion thereof) of the semiconductor diode structure 302 exhibits reflectivity that is less than corresponding Fresnel reflectivity between semiconductor material and the ambient medium 99 without the anti-reflection coating. The anti-reflection coating can be of any suitable type or arrangement. In some examples the anti-reflection coating can include a single-layer quarter-wave dielectric thin film. In some examples the anti-reflection coating can include a multi-layer dielectric thin film. In some examples the anti-reflection coating can include a moth-eye structure or other similar nanostructured film, or a gradient-index film. In principle the reflectivity of those portions of the front surface of the diode structure 302 where the output light exits is most desirably reduced to zero. In practice, in some examples the anti-reflection coating can reduce the reflectivity of those regions of the front surface of the semiconductor diode structure 302 to less than about 10.%, less than about 5.%, less than about 2.0%. less than about 1.0%, or less than about 0.5%. Contrast that with Fresnel reflectivity (at normal incidence) of an interface between a semiconductor and air (about 25%) or between a semiconductor and silicone (about 11%). In some examples, the front-surface layer or coating 306 can include regions with differing wavelength transmission, e.g., arranged as dichroic, edge, bandpass, or notch filters having differing spectral characteristics.

The redirection layer 308 on the back surface of the diode structure 302 (or portions thereof that exhibit non-specular reflective redirection) includes one or more of (i) an array of nano-antennae, (ii) a partial photonic bandgap structure, (iii) a photonic crystal, or (iv) an array of meta-atoms or meta-molecules (described further below). In some examples, some or all of the redirection layer 308 is arranged so that at least a portion of light incident within the diode structure 302 at an incidence angle greater than OC (i.e., oblique light) is redirected to propagate within the diode structure 302 at an angle less than $\Theta_C$ (i.e., as perpendicular light). By the reciprocity of Maxwell's equations, such portions of the redirection layer 308 will also redirect perpendicular light to propagate as oblique light. An effect of an anti-reflection coating on the front surface of the diode structure 302 is to enable perpendicular light propagating within the diode structure 302 to escape by transmission through the desired regions of the front surface as device output light instead of being reflected by the front surface and redirected as oblique light by the redirection layer 308. In principle that redirected oblique light can be redirected again to propagate as perpendicular light and escape through the front surface, but at the expense of another round trip through the diode structure 302.

In some examples, the redirection layer 308, or reflective portions of the front-surface layer or coating 306, exhibits an efficiency of redirection, of the light incident within the diode structure 302, that is greater than about 80.%, greater than about 85.%, greater than about 90.%, or greater than about 95.%. In some examples, the redirection layer 308, or reflective portions of the front-surface layer or coating 306, exhibits optical loss per pass for light incident thereon that is less than about 20.%, less than about 10.%, less than about 5.%, less than about 2.0%, or less than about 1.0%. Design or optimization of the redirection layer 308, or reflective portions of the front-surface layer or coating 306, can be performed (by calculation, simulation, or iterative designing/making/testing of prototypes or test devices), typically with increased overall extraction efficiency as a primary or secondary figure-of-merit. Instead or in addition, reduction of cost or manufacturing complexity can be employed as primary or secondary figures-of-merit in such design or optimization processes.

In the examples of FIGS. 4-6 the device 300 further includes a dielectric layer 310 and a reflective layer 312. The dielectric layer 310 is positioned on the back surface of the redirection layer 308 (with the redirection layer 308 between the dielectric layer 310 and the back surface of the diode structure 302), and is substantially transparent and characterized by a refractive index lower than that of the diode structure 302 (at the nominal vacuum wavelength $\lambda_o$). The reflective layer 312 is positioned on the back surface of the dielectric layer 310 (with the dielectric layer 310 between the reflective layer 312 and the back surface of the redirection layer 308). The redirection layer 308 (or at least portions thereof) is arranged to exhibit both reflective and transmissive redirection of output light within the diode structure 302. The diode structure 302, active layer 304, and any front-surface layer or coating 306 can be arranged in any suitable way with any suitable material composition, including those described above. The reflective layer 312 can exhibit reflectivity, at the nominal vacuum wavelength $\lambda_o$, that is greater than about 90.%, greater than about 95.%, or greater than about 98.%. Typically, larger reflectivity will result in higher extraction efficiency. The reflective layer 312 can be of any suitable type or arrangement, and can include one or more materials among: doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more optical glasses; one or more doped or undoped polymers; or one or more metals or metal alloys. In some examples, the reflective layer 312 includes a metallic coating or a dielectric coating (e.g., a multi-layer dielectric thin film). The dielectric layer 310 can be a few hundred nanometers thick up to several micrometers thick, and can include one or more materials among: doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers.

In some examples arranged as in FIGS. 4-6, the back surface of the dielectric layer 310 can include corrugations, dimples, bumps, protrusions, or depressions; those surface features can arise during growth or deposition of the dielectric layer 310 on the redirection layer 308, if the morphology of the redirection layer 308 is not planar. That is often the case, e.g., when the redirection layer 308 includes an array of nano-antennae, meta-atoms, or meta-molecules. That topology is reflected to some degree (typically somewhat smoothed out) in the surface of the dielectric layer 310. Deposition or growth of the reflective layer 312 often results in roughly conformal coverage of the surface of the dielectric layer 310. The non-planarity of the dielectric layer 310 can be advantageous, in that reflection from that surface will tend to mix oblique and perpendicular light propagating within the dielectric layer 310, which in some instances can enhance overall extraction efficiency. In some examples, such non-planarity of the dielectric layer 310 can be imparted by design, e.g., to a degree greater than that arising from the presence of the redirection layer 308 during deposition or growth of the dielectric layer 310.

Whichever of the arrangements described above is employed, in some examples the light-emitting device 300 can exhibit an extraction efficiency that is greater than about 80.%, greater than about 90.%, or greater than about 95.%. In some examples the light-emitting device 300 exhibits a mean number of redirections per photon emitted by the active layer 304 (by the redirection surface 308 or, if present, the reflective layer 312), before transmission by the front surface, that is less than 30, less than 20, less than 10, or less than 5.

In some examples the redirection layer 308 (or at least portions thereof), or non-specular or non-refractive portions of the front-surface layer or coating 306, can include an array of nano-antennae 309. Several examples are illustrated schematically in FIGS. 18A-18D, in which the nano-antennae 309 are shown extending from the semiconductor diode structure 302 into a medium 98 (e.g., an encapsulant or ambient medium against the layer 306 or 308); in other examples (not shown) the nano-antennae 309 can extend from the back surface of the diode structure 302 into the dielectric layer 310, from the front or back surface of the diode structure 302 into the ambient medium 99, or can extend from the front of back surface into the semiconductor material of the diode structure 302. The nano-antennae 309 can include one or more antenna materials, and can be shaped, sized and spaced relative to the nominal output vacuum wavelength $\lambda_0$, and arranged along the redirection layer 308 or redirective portions of the coating or layer 306), e.g., so as to reradiate, upon irradiation by active-layer output light at an incidence angle greater than the critical angle $\Theta_C$, at least a portion of the active-layer output light so as to result collectively in redirection of that active-layer output light to propagate at an incidence angle less than $\Theta_C$. Other arrangements of the redirection layer 308 or redirective portions of the coating or layer 306 can be employed to achieve other desired combinations in incident and redirected angles. Any suitable sizes, spacing, materials (e.g., silicon or $TiO_2$), antenna shapes (e.g., cylindrical, frusto-conical, frusto-pyramidal, horizontal dimers, vertical dimers, coaxial dimers, and so forth; as in, e.g., FIGS. 18A-18D), and arrangements (e.g., triangular grid, rectangular grid, hexagonal grid, other grids, or an irregular, aperiodic, or random arrangement) can be employed.

Typically, calculation or computer simulation is required to achieve at least a preliminary design for a nano-antennae array; a final design can typically be achieved by iterative experimental optimization of the various parameters by fabricating and characterizing light-emitting device incorporating test arrays in their corresponding redirection layer 308 or redirective portions of layer or coating 306. Note that an array that is not necessarily fully optimized can nevertheless provide redirection efficiency adequate to provide an acceptably high extraction efficiency for the light-emitting device 100; such partly optimized arrays fall within the scope of the present disclosure or appended claims. Examples of suitable nano-antennae arrays can be found in, e.g., (i) U.S. Pat. Pub. No. 2020/0200955 entitled "High brightness directional direct emitter with photonic filter of angular momentum" published Jun. 25, 2020 in the names of Antonio Lopez-Julia and Venkata Ananth Tamma, (ii) U.S. non-provisional application Ser. No. 17/119,528 entitled "Light-emitting device assembly with light redirection or incidence-angle-dependent transmission through an escape surface" filed Dec. 11, 2020 in the names of Antonio Lopez-Julia and Venkata Ananth Tamma, (iii) Li et al, "All-Dielectric Antenna Wavelength Router with Bidirectional Scattering of Visible Light," Nano Letters, 16 4396 (2016), and (iv) (i) Shibanuma et al, "Experimental Demonstration of Tunable Directional Scattering of Visible Light from All-Dielectric Asymmetric Dimers," *ACS Photonics,* 4 489 (2017), each of which is incorporated by reference as if fully set forth herein.

In some examples, the redirection layer 308 (or at least portions thereof), or non-specular or non-refractive portions of the front-surface layer or coating 306, can include a partial photonic bandgap structure arranged with one or more materials, morphology, and spacing relative the nominal output vacuum wavelength $\lambda_0$, e.g., so as to redirect, upon irradiation by active-layer output light at an incidence angle greater than the critical angle $\Theta_C$, at least a portion of the active-layer output light to propagate at an incidence angle less than $\Theta_C$. Other arrangements of the redirection layer 308 or redirective portions of the coating or layer 306 can be employed to achieve other desired combinations in incident and redirected angles. In some examples the redirection layer 308 (or at least portions thereof), or non-specular or non-refractive portions of the front-surface layer or coating 306, can include can include a photonic crystal arranged with one or more materials, crystal morphology, and crystal-lattice spacing relative the nominal output vacuum wavelength $\lambda_0$, e.g., so as to redirect, upon irradiation by active-layer output light at an incidence angle greater than the critical angle $\Theta_C$, at least a portion of the active-layer output light to propagate at an incidence angle less than $\Theta_C$. Other arrangements of the redirection layer 308 or redirective portions of the coating or layer 306 can be employed to achieve other desired combinations in incident and redirected angles. In some examples the redirection layer 308 (or at least portions thereof), or non-specular or non-refractive portions of the front-surface layer or coating 306, can include an array of meta-atoms or meta-molecules that are composed of one or more meta-materials, sized relative to the nominal output vacuum wavelength $\lambda_0$, arranged along the layer 306 or 308 and spaced relative to the nominal output vacuum wavelength $\lambda_0$, and shaped, e.g., so as to reradiate, upon irradiation by active-layer output light at an incidence angle greater than the critical angle $\Theta_C$, at least a portion of the active-layer output light so as to result collectively in redirection of that active-layer output light to propagate at an incidence angle less than $\Theta_C$. Other arrangements of the redirection layer 308 or redirective portions of the coating or layer 306 can be employed to achieve other desired combinations in incident and redirected angles. In any of those examples, calculation or simulation followed by iterative experimental optimization (or at least partial optimization) can be employed, in a manner similar to that described above.

Those regions of the front-surface layer or coating 306 where output light exits the diode structure 306 can include, instead of or in addition to an antireflection coating, an arrangement for non-refractive transmissive redirection of the exiting output light. Such an arrangement can result in the output light exiting the diode structure 302 to propagate in a desired angular distribution or with desired convergence, collimation, or divergence.

Figure 19C:
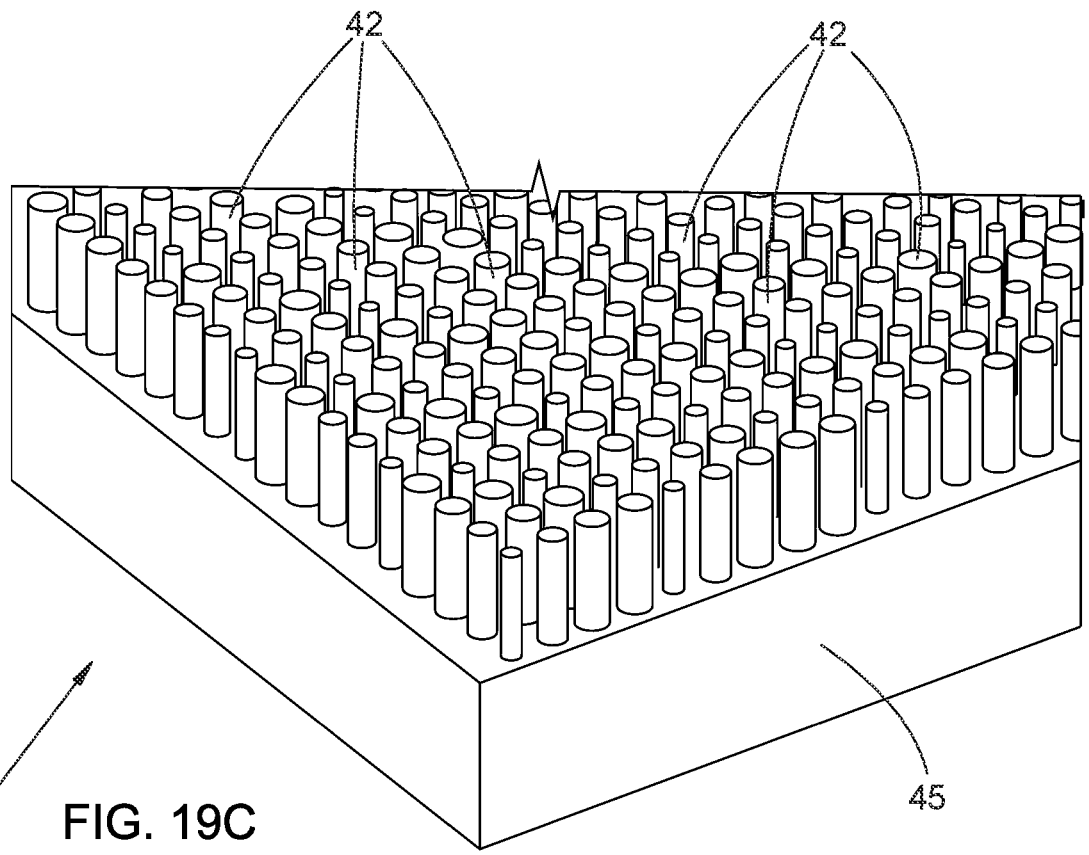
FIGS. 19A-19C are top, perspective, and enlarged views, respectively, of an example of a structured lens for a light-emitting device.
Figure 19A:
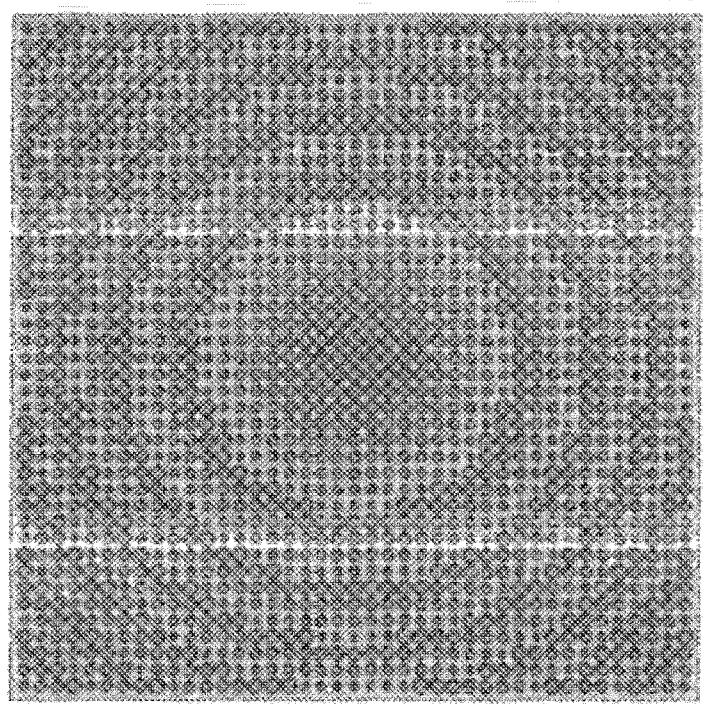
Figure 19B:
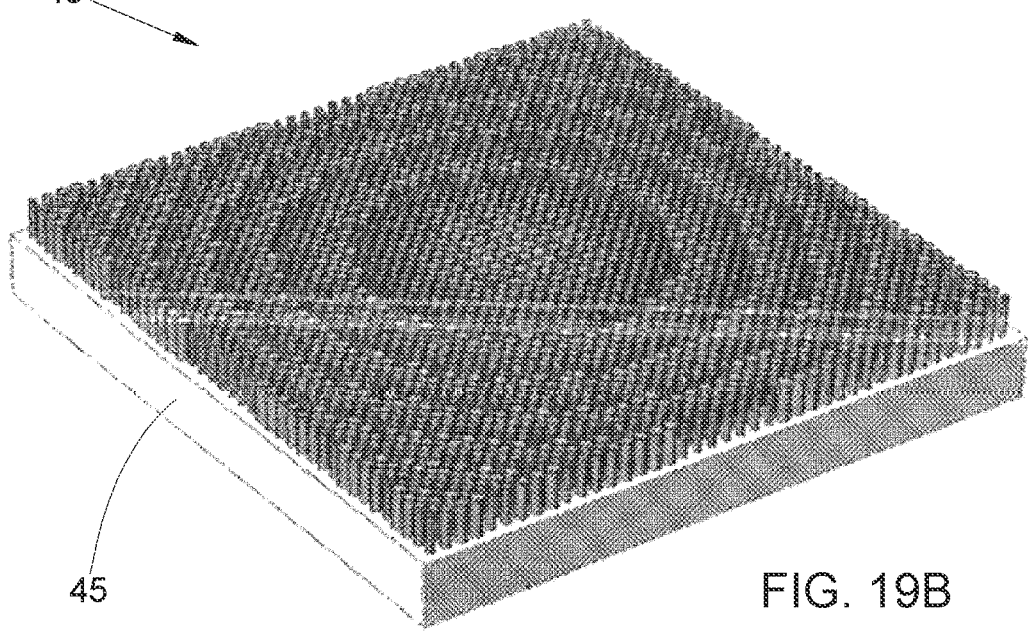

FIGS. 19A-19C illustrate schematically a multitude of micro- or nano-structured elements 42 forming a structured lens 40 (sometimes referred to as a "metalens"). The elements 42 can include a multitude of suitably sized and shaped projections, holes, depressions, inclusions, or structures formed on or in the substrate 45, in some examples as, e.g., an array of nano-antennae, a partial photonic bandgap structure, a photonic crystal, or an array of meta-atoms or meta-molecules. Those micro- or nano-structured elements 42 can be arranged so as to collectively impart on the output light a transverse-position-dependent phase delay that results in the effective focal length of the structured lens 40. In some examples, to approximate a simple spherical lens, a quadratic phase function can be employed. An example phase function is illustrated schematically in FIGS. 20A and 20B. In the examples of FIGS. 19A-19C the nano- or micro-structured elements are cylindrical columns 42 of varying diameters positioned on the surface of the substrate 45. The columns 42 can extend into the semiconductor material of the diode structure 302 or the surrounding medium 99. Average fractional area occupied by the columns 42 varies across the substrate 45 so that the columns collectively impart the desired phase function and effective focal length and produce desired collimation, convergence, or divergence of the output light exiting the diode structure 302. That example and others are disclosed in U.S. Patent Pub. No. 2019/0113727 entitled "Nanostructured meta-materials and meta-surfaces to collimate light emissions from LEDs" published Apr. 18, 2019 in the name of Venkata Ananth Tamma; that published application and the references cited therein are incorporated by reference as if set forth herein in their entireties.

In some examples, non-refractive transmissive redirection of output light to propagate at an angle less than its incident or refracted angle (e.g., as in FIG. 21) can be employed to result in a desired angular distribution of the output light exiting the diode structure 302. FIGS. 22A and 22B illustrate schematically output light angular distributions without and with such non-refractive redirection, respectively. In some examples, regions of the front-surface layer or coating 306 where output light exits the diode structure 302 can include one or more of (i) an array of nano-antennae, (ii) a partial photonic bandgap structure, (iii) a photonic crystal, or (iv) an array of meta-atoms or meta-molecules (materials, morphologies, and optimization described above), with one or more materials, morphology, and spacing relative the nominal output vacuum wavelength $\lambda_O$, so as to redirect, upon irradiation by device output light, at least a portion of the device output light so as to result in a desired or specified non-refractive transmissive redirection. In any of those examples, calculation or simulation followed by iterative experimental optimization (or at least partial optimization) can be employed, in a manner similar to that described above, to arrive at or near to the desired angular distribution of output light.

In any of the arrangements described above for the redirection layer 308 or the front-surface layer or coating 306, they can include one or more materials among: doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more optical glasses; one or more doped or undoped polymers; or one or more metals or metal alloys.

A method for making the light-emitting device 300 includes: (a) forming within the diode structure 302 the one or more light-emitting active layers 304; (b) forming on the front surface of the diode structure 302 the front-surface coating or layer 306; and (c) forming on the back surface of the diode structure 302 the back-surface redirection layer 308. In some examples the method can further include: (d) forming on the back surface of the redirection layer 308 the dielectric layer 310 with the redirection layer 308 between the dielectric layer 310 and the back surface of the diode structure 302; and (e) forming on the back surface of the dielectric layer 310 the reflective layer 312 with the dielectric layer 310 between the reflective layer 312 and the back surface of the redirection layer 308. Any suitable one or more fabrication or material processing techniques can be employed, in particular for forming the active layers 304, the redirection layer 308, and the front-surface layer or coating 306 in any suitable arrangement (including all of those described above). Suitable techniques can include, but are not limited to, layer growth, masked or non-masked deposition, masked or non-masked lithography, masked or non-masked wet or dry etching, epitaxy, direct-write, self-assembly, and so forth. Which one or more techniques are suitable, desirable, or necessary depends on the nature of the active layer 304, the redirection layer 308, or the front-surface layer or coating 306 (e.g., p-n junction, multi-quantum well, nano-antenna array, meta-molecules, multilayer dielectric, or other).

A method for operating the light-emitting device 300 includes supplying to the light-emitting device electrical power so that the light-emitting device 300 emits device output light from the front surface of the diode structure 302 to propagate in the ambient medium 99 against the front surface.

In some examples the light-emitting device 300 can include a wavelength-converting structure (e.g., red, green, and blue phosphors 406R/406G/406B in FIGS. 23B and 23C); such a light-emitting device can be referred to as a phosphor-converted light-emitting device 300, i.e., a pcLED. The wavelength-converting structure absorbs at least a portion of output light exiting the diode structure and emits down-converted light at one or more longer wavelengths. The fraction of the output light absorbed, the fraction of the output light transmitted by the wavelength converting structure, and the amount(s) and wavelength(s) of down-converted light produced by the wavelength-converting structure determine the color of the overall light output of the pcLED. In some examples white light of various color temperatures can be produced, or light at colors different from the output light of the diode structure can be produced.

In some examples only a single light-emitting device 300 or only a handful of light-emitting device 300 might be employed. In other examples an array 400 of multiple light-emitting devices 300 can be employed (e.g., as in FIGS. 23A-23C and 24B). Multiple LEDs 300 (or pcLEDs 300) can be assembled onto or formed together on a single substrate to form an array 400. An array 400 having one or several or many individual devices per millimeter (e.g., device pitch or spacing of about a millimeter, a few hundred microns, or less than 100 microns, and separation between adjacent devices less than 100 microns or only a few tens of microns or less) typically is referred to as a miniLED array or a microLED array (alternatively, a pLED array), or as pc-miniLED or pc-microLED arrays if wavelength-converting structures are included. Such arrays 400 can be employed to form active illuminated displays, such as those employed in, e.g., smartphones and smart watches, computer or video displays, augmented- or virtual-reality displays or other visualization systems, or signage, or to form adaptive illumination sources, such as those employed in, e.g., automotive headlights, street lighting, camera flash sources, or flashlights (i.e., torches); often in such devices an optical element or optical system spaced apart from the light-emitting array can be employed and arranged to couple light from the array into a display or into a specified area or region to be illuminated. The array 400 can include relatively few light-emitting devices 300 (e.g., 3×3, 5×5, or 7×7 arrays) or can include on the order of $10^1$, $10^2$, $10^3$, $10^4$, or more LEDs and or pcLEDs, e.g., as illustrated schematically in FIG. 23A. Individual LEDs 300 (i.e., pixels) may have widths $w_1$ (e.g., side lengths) in the plane of the array 400, for example, less than or equal to 1 millimeter (mm), less than or equal to 500 microns, less than or equal to 100 microns, or less than or equal to 50 microns. LEDs 100 in the array 400 may be spaced apart from each other by streets, lanes, or trenches 430 having a width $w_2$ in the plane of the array 400 of, for example, hundreds of microns, less than or equal to 100 microns, less than or equal to 50 microns, less than or equal to 20 microns, less than or equal to 10 microns, or less than or equal to 5 microns. The pixel pitch or spacing Di is the sum of $w_1$ and $w_2$. Although the illustrated examples show rectangular pixels arranged in a symmetric matrix, the pixels and the array may have any suitable shape or arrangement, whether symmetric or asymmetric. Multiple separate arrays of LEDs can be combined in any suitable arrangement in any applicable format to form a larger combined array or display. LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

The individual LEDs (pixels) in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

FIGS. 23B and 23C are examples of LED arrays 400 employed in display applications, wherein an LED display includes a multitude of display pixels. In some examples (e.g., as in FIG. 23B), each display pixel comprises a single semiconductor LED pixel 300 (not visible in the figure) and a corresponding phosphor pixel 406R, 406G, or 406B of a single color (red, green, or blue). Each display pixel only provides one of the three colors. In some examples (e.g., as in FIG. 23C), each display pixel includes multiple semiconductor LED pixels 300 (not visible in the figure) and multiple corresponding phosphor pixels 406 of multiple colors. In the example shown each display pixel includes a 3×3 array of semiconductor pixels 300; three of those LED pixels have red phosphor pixels 406R, three have green phosphor pixels 406G, and three have blue phosphor pixels 406B. Each display pixel can therefore produce any desired color combination. In the example shown the spatial arrangement of the different colored phosphor pixels 406 differs among the display pixels; in some examples (not shown) each display pixel can have the same arrangement of the different colored phosphor pixels 406. Any of the arrangements of FIG. 23B or 23C can be adapted to include direct-emitting LEDs, instead of or in addition to pcLEDs.

As shown in FIGS. 24A and 24B, an LED or pcLED array 400 may be mounted on an electronics board 500 comprising a power and control module 502, a sensor module 504, and an LED attach region 506. Power and control module 502 may receive power and control signals from external sources and signals from sensor module 504, based on which power and control module 502 controls operation of the LEDs. Sensor module 504 may receive signals from any suitable sensors, for example from temperature or light sensors. Alternatively, pcLED array 400 may be mounted on a separate board (not shown) from the power and control module and the sensor module.

In addition to the preceding, the following example embodiments fall within the scope of the present disclosure or appended claims:

Example 1. A semiconductor light-emitting device comprising: (a) a semiconductor diode structure having front and back surfaces and one or more light-emitting active layers within said diode structure that are arranged so as to emit output light at a nominal vacuum wavelength $\lambda_O$ to propagate within the diode structure; and (b) a redirection layer on the back surface of the diode structure, said back-surface redirection layer including one or more of (i) an array of nano-antennae, (ii) a partial photonic bandgap structure, (iii) a photonic crystal, or (iv) an array of meta-atoms or meta-molecules, at least a portion of the back-surface redirection layer being structurally arranged, relative to the nominal output vacuum wavelength $\lambda_O$, so as to exhibit non-specular internal reflective redirection of output light incident on the back surface within the diode structure, (c) one or both of the front or back surfaces including one or more structural arrangements that exhibit position-dependent redirection, reflection, or transmission of the output light, the one or more structural arrangements including one or both of (i) at least a portion of the back-surface redirection layer being structurally arranged so as to exhibit position-dependent internal reflective redirection of output light incident on the back surface within the diode structure, or (ii) the front surface including a layer or coating thereon, at least a portion of said front-surface layer or coating being structurally arranged so as to exhibit position-dependent internal reflective redirection, or position-dependent transmissive redirection, of output light incident on the front surface from within the diode structure.

Example 2. The device of Example 1, the position dependence of one or both of the back-surface redirection layer or the front-surface layer or coating being arranged so that output light exiting the diode structure through the front surface exhibits position-dependent luminance that varies with position across the front surface.

Example 3. The device of any one of Examples 1 or 2, the position dependence of one or both of the back-surface redirection layer or the front-surface layer or coating being arranged so that position dependence of luminance of the output light exiting the diode structure through the front surface differs from position dependence of emission of the output light emitted from the active layer.

Example 4. The device of any one of Examples 1 through 3, the position dependence of one or both of the back-surface redirection layer or the front-surface layer or coating being arranged so that, with substantially uniform emission of output light across the active layer, output light exiting the diode structure through the front surface exhibits position-dependent luminance that varies with position across the front surface.

Example 5. The device of any one of Examples 2 through 4, the position-dependent luminance: (i) exhibiting a maximum nearer to one edge of the diode structure and decreasing monotonically from that maximum along one transverse dimension across the diode structure, (ii) exhibiting a maximum intensity along a line extending across a central region of the diode structure and decreasing in both directions along one transverse dimension toward opposite edges of the diode structure, or (iii) exhibiting a maximum intensity at a central region of the diode structure and decreasing in both directions along both transverse dimensions toward edges of the diode structure.

Example 6. The device of any one of Examples 2 through 4, the position-dependent luminance including (i) a central region exhibiting a substantially constant non-zero luminance and (ii) a peripheral region surrounding the central region and exhibiting only negligible luminance.

Example 7. The device of any one of Examples 1 through 6, at least a portion of the back-surface redirection layer being structurally arranged so as to exhibit position-dependent, specular or non-specular, internal reflective redirection of output light incident on the back surface within the diode structure.

Example 8. The device of Example 7, the back-surface redirection layer exhibiting non-specular internal reflective redirection over only a first portion of the back surface of the diode structure and specular internal reflection over a second portion of the back surface of the diode structure distinct from the first portion thereof.

Example 9. The device of any one of Examples 7 or 8, at least a portion of the back-surface redirection layer exhibiting a position-dependent angle of non-specular internal reflective redirection.

Example 10. The device of any one of Examples 1 through 9, the back-surface redirection layer including two or more distinct areal regions that differ from one another with respect to the internal reflective redirection and over each of which the internal reflective redirection is substantially constant.

Example 11. The device of Example 10, the two or more distinct areal regions of the back-surface redirection layer including a central region surrounded by one or more nested peripheral regions.

Example 12. The device of any one of Examples 1 through 11, the back-surface redirection layer including at least one areal region over which the internal reflective redirection exhibits a gradient.

Example 13. The device of any one of Examples 1 through 12, at least a portion of the front surface being characterized, with respect to an ambient medium, by a critical angle $\Theta_C$ at the nominal vacuum wavelength $\lambda_0$, and at least a portion of the back-surface redirection layer being structurally arranged so as to redirect at least a portion of the output light, incident within the diode structure on the back-surface redirection layer at an incidence angle greater than ec, to propagate toward the front surface of the diode structure at an incidence angle with respect to the front surface that is less than $\Theta_C$.

Example 14. The device of any one of Examples 1 through 13, at least a portion of the front surface being characterized, with respect to an ambient medium, by a critical angle $\Theta_C$ at the nominal vacuum wavelength $\lambda_0$, and at least a portion of the front surface including an anti-reflection coating that is arranged so that that portion of the front surface exhibits reflectivity, for light incident on the front surface within the diode structure at an incidence angle less than $\Theta_C$, at the nominal vacuum wavelength $\lambda_0$, and with the front surface against the ambient medium, that is less than corresponding Fresnel reflectivity of an interface between the diode structure and the ambient medium without the anti-reflection coating.

Example 15. The device of any one of Examples 1 through 14, at least a portion of the front surface including a front-surface redirection layer that is arranged so that, with the front surface against an ambient medium, that portion of the front surface exhibits non-refractive transmissive redirection of output light, at the nominal vacuum wavelength $\lambda_0$, to propagate outside the diode structure at an angle less than a corresponding incidence angle of the output light incident on the front surface within the diode structure.

Example 16. The device of Example 15, the front-surface layer or coating including one or more of (i) an array of nano-antennae, (ii) a partial photonic bandgap structure, (iii) a photonic crystal, or (iv) an array of meta-atoms or meta-molecules, that are shaped, sized, and arranged, relative to the nominal output vacuum wavelength $\lambda_0$, so as to exhibit the non-refractive transmissive redirection.

Example 17. The device of any one of Examples 1 through 16, at least a portion of the front surface including a front-surface layer comprising micro- or nano-structured elements arranged, relative to the nominal output vacuum wavelength $\lambda_0$, as a structured lens resulting in reduced angular divergence, or a narrowed angular intensity distribution, of output light that exits the diode structure.

Example 18. The device of Example 17, the micro- or nano-structured elements of the structured lens including a multitude of suitably sized and shaped projections, holes, depressions, inclusions, or structures forming, formed on, or formed in the front-surface layer.

Example 19. The device of any one of Examples 17 or 18, the micro- or nano-structured elements of the structured lens including an array of nano-antennae, a partial photonic bandgap structure, a photonic crystal, or an array of meta-atoms or meta-molecules.

Example 20. The device of any one of Examples 1 through 19, the back-surface redirection layer including an array of nano-antennae that (i) include one or more antenna materials, (ii) are shaped, sized, and spaced relative to the nominal output vacuum wavelength $\lambda_0$, and (iii) are arranged along the back-surface redirection layer so as to reradiate, upon irradiation by output light, at least a portion of the output light to result collectively in the non-specular internal reflective redirection thereof.

Example 21. The device of any one of Examples 1 through 20, the back-surface redirection layer including a partial photonic bandgap structure arranged with one or more materials, morphology, and spacing relative the nominal output vacuum wavelength $\lambda_0$ so as to redirect, upon irradiation by active-layer output light, at least a portion of the output light to result collectively in the non-specular internal reflective redirection thereof.

Example 22. The device of any one of Examples 1 through 21, the back-surface redirection layer including a photonic crystal arranged with one or more materials, crystal morphology, and crystal-lattice spacing relative the nominal output vacuum wavelength $\lambda_0$ so as to redirect, upon irradiation by output light, at least a portion of the output light to result collectively in the non-specular internal reflective redirection thereof.

Example 23. The device of any one of Examples 1 through 22, the back-surface redirection layer including an array of meta-atoms or meta-molecules that (i) include one or more meta-materials, (ii) are shaped, sized, and spaced relative to the nominal output vacuum wavelength $\lambda_0$, and (iii) are arranged along the back-surface redirection layer so as to reradiate, upon irradiation by output light, at least a portion of the output light to result collectively in the non-specular internal reflective redirection thereof.

Example 24. The device of any one of Examples 1 through 23, the back-surface redirection layer including a diffuse backscatterer arranged so as to backscatter, upon irradiation by output light, at least a portion of the output light to result collectively in the non-specular internal reflective redirection thereof.

Example 25. The device of any one of Examples 1 through 24, the front surface including the front-surface layer or coating thereon, at least a portion thereof being structurally arranged so as to exhibit position-dependent specular or non-specular internal reflective redirection, or position-dependent refractive or non-refractive transmissive redirection, of output light incident on the front surface from within the diode structure.

Example 26. The device of Example 25, the front-surface coating or layer being structurally arranged so that (i) a first set of one or more areal regions of the front surface of the diode structure exhibits transmissivity for output light incident thereon within the diode structure, at the nominal vacuum wavelength $\lambda_O$ and with the front surface against the ambient medium, that is greater than Fresnel transmissivity from an interface between an ambient medium and the front surface of the diode structure without the front-surface coating or layer, or (ii) a second set of one or more areal regions of the front surface of the diode structure, distinct from the areal regions of the first set, exhibits transmissivity for output light incident thereon within the diode structure, at the nominal vacuum wavelength $\lambda_O$ and with the front surface against the ambient medium, that is less than the Fresnel transmissivity.

Example 27. The device of Example 26, the front surface of the diode structure being positioned against the ambient medium, the ambient medium being substantially solid and including one or more materials among: doped or undoped silicone, or one or more doped or undoped polymers.

Example 28. The device of Example 26, the front surface of the diode structure being positioned against the ambient medium, the ambient medium comprising vacuum, air, a gaseous medium, or a liquid medium.

Example 29. The device of any one of Examples 26 through 28, a first portion of the front-surface layer being (i) positioned on the areal regions of the first set and (ii) arranged as an anti-reflection coating so that the areal regions of the first set exhibit transmissivity, for output light at the nominal vacuum wavelength $\lambda_O$ incident on the front surface within the diode structure with the front surface against the ambient medium, that is greater than the Fresnel transmissivity.

Example 30. The device of Example 29, the anti-reflection coating including a single-layer quarter-wave dielectric thin film or a multi-layer dielectric thin film.

Example 31. The device of Example 29, the anti-reflection coating including a moth-eye structure or an index-gradient film.

Example 32. The device of any one of Examples 29 through 31, reflectivity of the front surface of the diode structure with the anti-reflection coating being less than about 10.%, less than about 5.%, less than about 2.0%, less than about 1.0%, or less than about 0.5%.

Example 33. The device of any one of Examples 29 through 32, the anti-reflection coating including one or more materials among: doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers.

Example 34. The device of any one of Examples 26 through 33, a first portion of the front-surface layer being (i) positioned on the areal regions of the first set and (ii) arranged so as to exhibit, for output light at the nominal vacuum wavelength $\lambda_O$ incident on the front surface within the diode structure with the front surface against the ambient medium, non-refractive transmissive redirection of the output light to propagate outside the diode structure at an exit angle less than a corresponding refracted angle of the output light incident on the front surface within the diode structure.

Example 35. The device of any one of Examples 26 through 34, a second portion of the front-surface layer being (i) positioned on the areal regions of the second set and (ii) arranged so as to exhibit specular internal reflection of light incident on the front surface within the diode structure.

Example 36. The device of Example 35, the second portion of the front-surface layer or coating comprising at multi-layer dielectric reflective coating or a metallic reflective coating.

Example 37. The device of any one of Examples 26 through 36, a second portion of the front-surface layer being (i) positioned on the areal regions of the second set and (ii) arranged so as to exhibit, for output light at the nominal vacuum wavelength $\lambda_O$ incident on the front surface within the diode structure, non-specular internal reflective redirection.

Example 38. The device of Example 37, the second portion of the front-surface layer or coating exhibiting a position-dependent angle of non-specular internal reflective redirection.

Example 39. The device of any one of Examples 25 through 38, each areal region of the first and second sets differing from at least one other areal region of the first and second sets with respect to internal reflective redirection or transmissive redirection, the internal reflective redirection or the transmissive redirection being substantially constant over the corresponding areal region.

Example 40. The device of Example 39, the areal regions of the first and second sets including a central region surrounded by one or more nested peripheral regions.

Example 41. The device of any one of Examples 25 through 40, the front-surface layer or coating including at least one areal region over which the internal reflective redirection or the transmissive redirection exhibits a gradient.

Example 42. The device of any one of Examples 1 through 41, the front-surface layer or coating including one or more of (i) an array of nano-antennae, (ii) a partial photonic bandgap structure, (iii) a photonic crystal, or (iv) an array of meta-atoms or meta-molecules, that are arranged, relative to the nominal output vacuum wavelength $\lambda_O$, so as to exhibit non-specular internal reflective redirection or non-refractive transmissive redirection.

Example 43. The device of any one of Examples 25 through 42, the front-surface layer or coating including an array of nano-antennae that (i) include one or more antenna materials, (ii) are shaped, sized, and spaced relative to the nominal output vacuum wavelength $\lambda_O$, and (iii) are arranged along the front-surface coating or layer so as to reradiate, upon irradiation by output light, at least a portion of the output light to result collectively in the non-specular internal reflective redirection or the non-refractive transmissive redirection thereof.

Example 44. The device of any one of Examples 25 through 43, the front-surface layer or coating including a partial photonic bandgap structure arranged with one or more materials, morphology, and spacing relative the nominal output vacuum wavelength $\lambda_O$ so as to redirect, upon irradiation by active-layer output light, at least a portion of the output light to result collectively in the non-specular internal reflective redirection or the non-refractive transmissive redirection thereof.

Example 45. The device of any one of Examples 25 through 44, the front-surface layer or coating including a photonic crystal arranged with one or more materials, crystal morphology, and crystal-lattice spacing relative the nominal output vacuum wavelength $\lambda_O$ so as to redirect, upon irradiation by output light, at least a portion of the output light to result collectively in the non-specular internal reflective redirection or the non-refractive transmissive redirection thereof.

Example 46. The device of any one of Examples 1 through 45, the front-surface layer or coating including an array of meta-atoms or meta-molecules that (i) include one or more meta-materials, (ii) are shaped, sized, and spaced relative to the nominal output vacuum wavelength $\lambda_0$, and (ii) are arranged along the front-surface coating or layer so as to reradiate, upon irradiation by output light, at least a portion of the output light to result collectively in the non-specular internal reflective redirection or the non-refractive transmissive redirection thereof.

Example 47. The device of any one of Examples 1 through 46, the front-surface layer or coating including at least one region having wavelength-dependent transmission that differs from wavelength-dependent transmission of at least one other region of the front-surface layer or coating.

Example 48. The device of any one of Examples 1 through 47, one or both of the back-surface redirection layer or the front-surface coating or layer including one or more materials among: doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more optical glasses; one or more doped or undoped polymers; or one or more metals or metal alloys.

Example 49. The device of any one of Examples 1 through 48, one or both of the back-surface redirection layer or the front-surface layer or coating being arranged so that the device exhibits a mean total number of internal redirections and internal reflections per photon of output light emitted by the active layer before exiting the diode structure through the front surface that is less than 30, less than 20, less than 10, or less than 5.

Example 50. The device of any one of Examples 1 through 49, the light-emitting device exhibiting a photon extraction efficiency that is greater than about 80.%, greater than about 90.%, or greater than about 95.%.

Example 51. The device of any one of Examples 1 through 50, the back-surface redirection layer exhibiting a redirection efficiency that is greater than about 80.%, greater than about 85.%, greater than about 90.%, or greater than about 95.%.

Example 52. The device of any one of Examples 1 through 51, the back-surface redirection layer exhibiting optical loss per pass for light incident thereon that is less than about 20.%, less than about 10.%, less than about 5.%, less than about 2.0%, or less than about 1.0%.

Example 53. The device of any one of Examples 1 through 52 further comprising (i) a dielectric layer on the back-surface redirection layer with the back-surface redirection layer between the dielectric layer and the back surface of the diode structure, the dielectric layer being substantially transparent at the nominal vacuum wavelength $\lambda_0$ and characterized by a refractive index lower than that of the diode structure, and (ii) a reflective layer on the dielectric layer with the dielectric layer between the reflective layer and the back-surface redirection layer.

Example 54. The device of Example 53, the back-surface redirection layer exhibiting a redirection efficiency that is greater than about 20.%, greater than about 40.%, greater than about 60.%, or greater than about 80.%.

Example 55. The device of any one of Examples 53 or 54, the reflective layer exhibiting reflectivity, at the nominal vacuum wavelength $\lambda_0$, that is greater than about 90.%, greater than about 95.%, or greater than about 98.%.

Example 56. The device of any one of Examples 53 through 55, the reflective layer including a metallic coating or a dielectric coating.

Example 57. The device of any one of Examples 53 through 56, the dielectric layer including one or more materials among: doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more optical glasses; or one or more doped or undoped polymers.

Example 58. The device of any one of Examples 53 through 57, the reflective layer including one or more materials among: doped or undoped silicon; one or more doped or undoped II-VI, or Group IV semiconductors; doped or undoped silicon oxide, nitride, or oxynitride; one or more doped or undoped metal oxides, nitrides, or oxynitrides; one or more optical glasses; one or more doped or undoped polymers; or one or more metals or metal alloys.

Example 59. The device of any one of Examples 1 through 58, the nominal output vacuum wavelength $\lambda_0$ being larger than about 0.20 μm, larger than about 0.4 μm, larger than about 0.8 μm, smaller than about 10. μm, smaller than about 2.5 μm, or smaller than about 1.0 μm.

Example 60. The device of any one of Examples 1 through 59, the semiconductor diode structure comprising a semiconductor light-emitting diode.

Example 61. The device of any one of Examples 1 through 60, the diode structure including one or more doped or undoped II-VI, or Group IV semiconductor materials or alloys or mixtures thereof.

Example 62. The device of any one of Examples 1 through 61, the light-emitting layer including one or more doped or undoped II-VI, or Group IV semiconductor materials or alloys or mixtures thereof.

Example 63. The device of any one of Examples 1 through 62, the light-emitting layer including one or more p-n junctions, one or more quantum wells, one or more multi-quantum wells, or one or more quantum dots.

Example 64. The device of any one of Examples 1 through 63 further comprising a wavelength-converting structure facing the front surface and positioned and arranged so as to absorb at least a portion of the output light propagating away from the front surface and to emit down-converted light at one or more wavelengths longer than the nominal vacuum wavelength $\lambda_0$.

Example 65. A method for making the light-emitting device of any one of Examples 1 through 64, the method comprising: (a) forming within the diode structure the one or more light-emitting active layers; (b) forming on the front surface of the diode structure the front-surface coating or layer; and (c) forming on the back surface of the diode structure the back-surface redirection layer.

Example 66. The method of Example 65 further comprising: (d) forming on the back surface of the redirection layer the dielectric layer with the redirection layer between the dielectric layer and the back surface of the diode structure; and (e) forming on the back surface of the dielectric layer the reflective layer with the dielectric layer between the reflective layer and the back surface of the redirection layer.

Example 67. A method for operating the light-emitting device of any one of Examples 1 through 64, the method comprising supplying to the light-emitting device electrical power so that the light-emitting device emits device output light from the front surface of the diode structure to propagate in an ambient medium against the front surface.

Example 68. An array of multiple light-emitting devices of any one or more of Examples 1 through 64.

Example 69. The array of Example 68, each light-emitting device of the array being operable independently of at least one other light-emitting device of the array.

Example 70. The array of Example 68, each light-emitting device of the array being operable independently of every other light-emitting device of the array.

Example 71. The array of any one of Examples 68 through 70, non-zero spacing or pitch of the light-emitting devices of the array being less than 1.0 mm, less than 0.5 mm, less than 0.3 mm, less than 0.2 mm, less than 0.10 mm, less than 0.08 mm, less than 0.05 mm, less than 0.03 mm, or less than 0.02 mm.

Example 72. The array of any one of Examples 68 through 71, the light-emitting devices of the array being separated by non-light-emitting pixel borders having a non-zero width less than 0.10 mm, less than 0.05 mm, less than 0.03 mm less than 0.02 mm, less than 0.010 mm, or less than 0.005 mm.

Example 73. A display system comprising: (i) the array of any one of Examples 68 through 72, (ii) a display, and (iii) an optical element or optical system spaced apart from the array and arranged to couple light from the array into the display.

Example 74. A mobile device comprising: (i) a camera, (ii) the array of any one of Examples 68 through 72, and (iii) an optical element or optical system spaced apart from the array and arranged to direct light emitted by the array into a field of view of the camera.

Example 75. An illumination system comprising: (i) the array of any one of Examples 68 through 72, and (ii) an optical element or optical system spaced apart from the array and arranged to direct light emitted by the array into an area or region to be illuminated.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. Similarly, "one or more of a dog or a cat" would be interpreted as including (i) one or more dogs without any cats, (ii) one or more cats without any dogs, or (iii) one or more dogs and one or more cats, unless explicitly stated otherwise or the alternatives are understood or disclosed (implicitly or explicitly) to be mutually exclusive or incompatible. Similarly, "one or more of a dog, a cat, or a mouse" would be interpreted as (i) one or more dogs without any cats or mice, (ii) one or more cats without any dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. "Two or more of a dog, a cat, or a mouse" would be interpreted as (i) one or more dogs and one or more cats without any mice, (ii) one or more dogs and one or more mice without any cats, (iii) one or more cats and one or more mice without any dogs, or (iv) one or more dogs, one or more cats, and one or more mice; "three or more," "four or more," and so on would be analogously interpreted. For any of the preceding recitations, if any pairs or combinations of the included alternatives are understood or disclosed (implicitly or explicitly) to be incompatible or mutually exclusive, such pairs or combinations are understood to be excluded from the corresponding recitation. For purposes of the present disclosure and appended claims, the words "comprising," "including," "having," and variants thereof, wherever they appear, shall be construed as open ended terminology, with the same meaning as if a phrase such as "at least" were appended after each instance thereof, unless explicitly stated otherwise.

For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A semiconductor light-emitting device comprising:
   a semiconductor diode structure having front and back surfaces and one or more light-emitting active layers within said diode structure that are arranged so as to emit output light at a nominal vacuum wavelength $\lambda_0$ to propagate within the diode structure;
   a redirection layer on the back surface of the diode structure, said back-surface redirection layer including one or more of (i) an array of nano-antennae, (ii) a partial photonic bandgap structure, (iii) a photonic crystal, or (iv) an array of meta-atoms or meta-molecules, at least a portion of the back-surface redirection layer being structurally arranged, relative to the nominal output vacuum wavelength $\lambda_0$, so as to exhibit non-specular internal reflective redirection of output light incident on the back surface within the diode structure; and
   a layer or coating on the front surface of the diode structure, at least a portion of said front-surface layer or coating being structurally arranged so as to exhibit position-dependent internal reflective redirection, or position-dependent transmissive redirection, of output light incident on the front surface from within the diode structure,
   wherein the front-surface coating or layer is structurally arranged so that (i) a first set of one or more areal regions of the front surface of the diode structure exhibits transmissivity for output light incident thereon within the diode structure, at the nominal vacuum wavelength $\lambda_0$ and with the front surface against the ambient medium, that is greater than Fresnel transmissivity from an interface between an ambient medium and the front surface of the diode structure without the front-surface coating or layer, or (ii) a second set of one or more areal regions of the front surface of the diode structure, distinct from the areal regions of the first set, exhibits transmissivity for output light incident thereon within the diode structure, at the nominal vacuum wavelength $\lambda_0$ and with the front surface against the ambient medium, that is less than the Fresnel transmissivity.

2. The device of claim 1, the position dependence of the front-surface layer or coating being arranged so that output light exiting the diode structure through the front surface exhibits position-dependent luminance that varies with position across the front surface.

3. The device of claim 2 wherein the position-dependent luminance: (i) exhibits a maximum nearer to one edge of the diode structure and decreases monotonically from that maximum along one transverse dimension across the diode structure, (ii) exhibits a maximum intensity along a line extending across a central region of the diode structure and decreases in both directions along one transverse dimension toward opposite edges of the diode structure, (iii) exhibits a maximum intensity at a central region of the diode structure and decreases in both directions along both transverse dimensions toward edges of the diode structure, or (iv) includes (1) a central region exhibiting a substantially constant non-zero luminance and (2) a peripheral region surrounding the central region and exhibiting only negligible luminance.

4. The device of claim 1 wherein the position dependence of the front-surface layer or coating is arranged so that, with substantially uniform emission of output light across the active layer, output light exiting the diode structure through the front surface exhibits position-dependent luminance that varies with position across the front surface.

5. The device of claim 1 wherein at least a portion of the back-surface redirection layer is structurally arranged so as to exhibit position-dependent, specular or non-specular, internal reflective redirection of output light incident on the back surface within the diode structure.

6. The device of claim 5 wherein (i) the back-surface redirection layer exhibits non-specular internal reflective redirection over only a first portion of the back surface of the diode structure and specular internal reflection over a second portion of the back surface of the diode structure distinct from the first portion thereof, or (ii) at least a portion of the back-surface redirection layer exhibits a position-dependent angle of non-specular internal reflective redirection.

7. The device of claim 5 wherein (i) the array of nano-antennae, (ii) the partial photonic bandgap structure, (iii) the photonic crystal, or (iv) the array of meta-atoms or meta-molecules of the back-surface redirection layer are shaped, sized, and arranged, relative to the nominal output vacuum wavelength $\lambda_0$, so as to result collectively in the non-specular internal reflective redirection of output light.

8. The device of claim 1 wherein at least a portion of the front-surface layer or coating includes one or more of (i) an array of nano-antennae, (ii) a partial photonic bandgap structure, (iii) a photonic crystal, or (iv) an array of meta-atoms or meta-molecules, that are shaped, sized, and arranged, relative to the nominal output vacuum wavelength $\lambda_0$ so that, with the front surface against an ambient medium, that portion of the front surface exhibits non-refractive transmissive redirection of output light, at the nominal vacuum wavelength $\lambda_0$, to propagate outside the diode structure at an angle less than a corresponding incidence angle of the output light incident on the front surface within the diode structure.

9. The device of claim 1 wherein at least a portion of the front-surface layer or coating comprises micro- or nanostructured elements arranged, relative to the nominal output vacuum wavelength $\lambda_0$, as a structured lens resulting in reduced angular divergence, or a narrowed angular intensity distribution, of output light that exits the diode structure.

10. The device of claim 9 wherein (i) the micro- or nano-structured elements of the structured lens include a multitude of suitably sized and shaped projections, holes, depressions, inclusions, or structures forming, formed on, or formed in the front-surface layer, or (ii) the micro- or nano-structured elements of the structured lens include an array of nano-antennae, a partial photonic bandgap structure, a photonic crystal, or an array of meta-atoms or meta-molecules.

11. The device of claim 1 wherein at least a portion of the back-surface redirection layer includes a diffuse backscatterer arranged so as to backscatter, upon irradiation by output light, at least a portion of the output light to result collectively in the non-specular internal reflective redirection thereof.

12. The device of claim 1 wherein (i) a first portion of the front-surface coating or layer is positioned on the areal regions of the first set and arranged so as to exhibit, for output light at the nominal vacuum wavelength $\lambda_0$ incident on the front surface within the diode structure with the front surface against the ambient medium, non-refractive transmissive redirection of the output light to propagate outside the diode structure at an exit angle less than a corresponding refracted angle of the output light incident on the front surface within the diode structure, and (ii) a second portion of the front-surface layer is positioned on the areal regions of the second set and arranged so as to exhibit one or both of (1) specular internal reflection of light incident on the front surface within the diode structure, or (2) for output light at the nominal vacuum wavelength $\lambda_0$ incident on the front surface within the diode structure, non-specular internal reflective redirection.

13. The device of claim 12 wherein the second portion of the front-surface layer or coating exhibits a position-dependent angle of non-specular internal reflective redirection.

14. The device of claim 1 wherein at least a portion of the front-surface layer or coating includes one or more of (i) an array of nano-antennae, (ii) a partial photonic bandgap structure, (iii) a photonic crystal, or (iv) an array of meta-atoms or meta-molecules, that are arranged, relative to the nominal output vacuum wavelength $\lambda_0$, so as to exhibit non-specular internal reflective redirection or non-refractive transmissive redirection.

15. The device of claim 1 wherein the front-surface layer or coating includes at least one region having wavelength-dependent transmission that differs from wavelength-dependent transmission of at least one other region of the front-surface layer or coating.

16. The device of claim 1 wherein the light-emitting device exhibits a photon extraction efficiency that is greater than about 80%, greater than about 90%, or greater than about 95%.

17. The device of claim 1 further comprising (i) a dielectric layer on the back-surface redirection layer with the back-surface redirection layer between the dielectric layer and the back surface of the diode structure, the dielectric layer being substantially transparent at the nominal vacuum wavelength $\lambda_0$ and characterized by a refractive index lower than that of the diode structure, and (ii) a reflective layer on the dielectric layer with the dielectric layer between the reflective layer and the back-surface redirection layer.

18. An array of multiple light-emitting devices of claim 1, each light-emitting device of the array being operable independently of at least one other light-emitting device of the array, non-zero spacing or pitch of the light-emitting devices of the array being less than 1.0 mm, and the light-emitting devices of the array being separated by non-light-emitting pixel borders having a non-zero width less than 0.10 mm.

* * * * *